(12) United States Patent
Kimura et al.

(10) Patent No.: US 7,881,414 B2
(45) Date of Patent: Feb. 1, 2011

(54) BIT RATE DISCRIMINATION CIRCUIT BASED ON A LOW FREQUENCY COMPONENT OF SIGNAL

(75) Inventors: Shunji Kimura, Chiba (JP); Tomoaki Yoshida, Chiba (JP); Koji Kitahara, Zama (JP); Hiroshi Takada, Mito (JP)

(73) Assignees: Nippon Telegraph and Telephone Corporation, Tokyo (JP); NTT Electronics Corporation, Tokyo (JP)

( * ) Notice: Subject to any disclaimer, the term of this patent is extended or adjusted under 35 U.S.C. 154(b) by 951 days.

(21) Appl. No.: 10/546,424

(22) PCT Filed: Feb. 16, 2005

(86) PCT No.: PCT/JP2005/002340
§ 371 (c)(1),
(2), (4) Date: Aug. 19, 2005

(87) PCT Pub. No.: WO2005/078927
PCT Pub. Date: Aug. 25, 2005

(65) Prior Publication Data
US 2006/0159163 A1 Jul. 20, 2006

(30) Foreign Application Priority Data
Feb. 16, 2004 (JP) ............................. 2004-037876

(51) Int. Cl.
*H04B 17/00* (2006.01)
(52) U.S. Cl. .................. 375/354; 375/225; 327/205
(58) Field of Classification Search .............. 375/224, 375/225, 316, 354; 327/74, 77, 336, 58, 327/205; 370/232
See application file for complete search history.

(56) References Cited

U.S. PATENT DOCUMENTS

| | | | | | |
|---|---|---|---|---|---|
| 2,837,642 | A | * | 6/1958 | Schenck | 327/35 |
| 2,912,579 | A | * | 11/1959 | Bates, Jr. | 327/31 |
| 3,074,019 | A | * | 1/1963 | Greenleaf et al. | 327/24 |
| 3,202,834 | A | * | 8/1965 | Pingry, III et al. | 327/36 |

(Continued)

FOREIGN PATENT DOCUMENTS

DE 3117927 A1 11/1982

(Continued)

*Primary Examiner*—Chieh M Fan
*Assistant Examiner*—Aristocratis Fotakis
(74) *Attorney, Agent, or Firm*—Oblon, Spivak, McClelland, Maier & Neustadt, L.L.P.

(57) ABSTRACT

A bit-rate discrimination circuit for determining which bit-rate an input signal has, a first bit-rate or a second bit-rate higher than the first bit-rate, is disclosed. The circuit is characterized by a frequency selection unit configured to filter out a signal having the second bit-rate, and allow at least a fraction of the low frequency component of a signal having the first bit-rate to pass through; a determination unit configured to determine whether the fraction of the low frequency component of the signal having the first bit-rate has passed through said frequency selection unit; a smoothing unit configured to smooth the output of said determination unit; and a level conversion unit configured to convert the output of said smoothing unit to a logic level. According to the above arrangements, the bit-rate of the input signal can be discriminated based on the low frequency component thereof.

14 Claims, 23 Drawing Sheets

U.S. PATENT DOCUMENTS

| | | | |
|---|---|---|---|
| 3,305,732 A * | 2/1967 | Merlen et al. | 361/182 |
| 3,543,172 A * | 11/1970 | Seppeler | 329/301 |
| 3,557,308 A * | 1/1971 | Alexander et al. | 375/376 |
| 3,737,789 A * | 6/1973 | McCoy et al. | 327/48 |
| 3,766,413 A * | 10/1973 | Berkovits | 327/25 |
| 3,780,727 A * | 12/1973 | King | 600/510 |
| 3,789,316 A * | 1/1974 | Goetz et al. | 331/12 |
| 3,825,842 A * | 7/1974 | Birchfield et al. | 327/23 |
| 5,546,025 A * | 8/1996 | Casselman | 327/43 |
| 5,638,408 A * | 6/1997 | Takaki | 375/341 |
| 5,757,221 A * | 5/1998 | Hayashi | 327/360 |
| 5,757,850 A * | 5/1998 | Takaki | 375/225 |
| 5,907,250 A | 5/1999 | Baizley et al. | |
| 6,038,253 A * | 3/2000 | Shimazaki | 375/224 |
| 6,118,829 A | 9/2000 | North | |
| 6,311,047 B1 | 10/2001 | Gotou | |
| 6,337,886 B1 * | 1/2002 | Asahi | 375/316 |
| 6,580,263 B2 * | 6/2003 | Choi et al. | 324/96 |
| 6,600,797 B1 * | 7/2003 | Hasegawa et al. | 375/376 |
| 6,710,605 B2 * | 3/2004 | Tang et al. | 324/614 |
| 6,947,494 B2 * | 9/2005 | Kim et al. | 375/316 |
| 7,043,206 B2 * | 5/2006 | Herdey et al. | 455/63.1 |
| 7,072,804 B2 * | 7/2006 | Weller | 702/190 |
| 7,136,329 B2 * | 11/2006 | Yoon et al. | 369/30.11 |
| 2002/0027694 A1 * | 3/2002 | Kim et al. | 359/189 |
| 2002/0065623 A1 * | 5/2002 | Choi et al. | 702/99 |
| 2003/0002108 A1 | 1/2003 | Ames et al. | |
| 2003/0102899 A1 | 6/2003 | Trivedi et al. | |
| 2004/0042544 A1 * | 3/2004 | Mejia | 375/225 |
| 2004/0233090 A1 * | 11/2004 | Miyasita et al. | 341/155 |

FOREIGN PATENT DOCUMENTS

| | | |
|---|---|---|
| JP | 08-204761 | 8/1996 |
| JP | 09-233030 | 9/1997 |
| JP | 2000-040960 | 2/2000 |
| JP | 3147038 | 1/2001 |
| JP | 2003-115894 | 4/2003 |

* cited by examiner

BIT RATE DISCRIMINATION CIRCUIT BASED ON A LOW FREQUENCY COMPONENT OF SIGNAL

TECHNICAL FIELD

The present invention generally relates to the discrimination of bit-rate, in particular, to a bit-rate discrimination circuit for discriminating the bit-rate of an input signal and outputting the result of the discrimination, a method of discriminating bit-rate used in the bit-rate discrimination circuit, and a multi bit-rate reception circuit using the bit-rate discrimination circuit.

BACKGROUND ART

A reception circuit capable of receiving signals of various transmission speeds (bit-rates) at respective optimal performance is proposed (for example, see Patent Document 1). Such a reception circuit uses a bit-rate discrimination circuit for automatically discriminating the bit-rate of an input signal.

FIG. 21 shows the bit-rate discrimination circuit described in the Patent Document 1. In FIG. 21, a reference numeral 1 denotes an input terminal; 2 denotes an output terminal; 3 denotes a delay circuit; 4 denotes an exclusive OR circuit; 5 denote a mean value detector; 6 denotes a level decision circuit; and 7 denotes a reference voltage input terminal. FIG. 22 shows waveforms at various points A-D in the bit-rate discrimination circuit shown in FIG. 21. In FIG. 22, the waveform A is that of an input signal; the waveform B is that of an output signal from the exclusive OR circuit 4; the waveform C is that of an output signal from the mean value detector 5; and the waveform D is that of an output signal from the level decision circuit 6.

The conventional bit-rate discrimination circuit shown in FIG. 21 has the delay circuit 3 and the exclusive OR circuit 4 at the input stage. When an input signal having the waveform A (input signal A) is fed to the input terminal 1, pulses are output at each rise and fall edges of the input signal A as shown as the waveform B, and the pulse width of the pulses are determined by the delay time of the delay circuit 3. The density of the pulses is high if the bit-rate of the input signal is high, and is low if the bit-rate of the input signal is low. The mean value detector 5 outputs high voltage for a high bit-rate input signal and low voltage for a low bit-rate input signal by averaging the density of the pulses in the input signal. The level decision circuit 6 compares the voltage level output from the mean value detector 5 with a reference voltage ($V_{ref}$), and outputs a control signal having the waveform D (control signal D).

Patent Document 1: Japanese Laid-Open Patent Application No. 2000-40960

However, the conventional bit-rate discrimination circuit shown in FIG. 21 can not discriminate the bit-rate accurately in the case of feeding back the control signal as the result of discrimination. FIG. 23 is a block diagram showing a multi bit-rate reception circuit using the conventional bit-rate discrimination circuit, which illustrates a case in which the above problem occurs. In FIG. 23, a reference numeral 1 denotes an input terminal; 8 denotes a variable gain/bandwidth preamplifier; 9 denotes a gain/bandwidth control terminal; 10 denotes a limiting amplifier; 11 denotes the bit-rate discrimination circuit shown in FIG. 21; 12 and 13 denote differential output terminals. This multi bit-rate reception circuit discriminates the bit-rate of the input signal using the bit-rate discrimination circuit 11, and controls the bandwidth and gain of the variable gain/bandwidth preamplifier 8 such that the bandwidth and gain are optimized in dependence on the bit-rate of the input signal.

When a low bit-rate input signal is fed, the bit-rate discrimination circuit 11 outputs a low bit-rate determination, which controls the variable gain/bandwidth preamplifier 8 to lower its upper limit frequency of band and to increase its gain, resulting in the increase in receiver sensitivity. However, if the bit-rate of the input signal is switched from low bit-rate to high bit-rate, the high frequency component of a signal fed to the bit-rate discrimination circuit 11 is lost because the upper limit frequency of the variable gain/bandwidth preamplifier 8 is low. Consequently, the bit-rate discrimination circuit can not discriminate the bit-rate of the signal accurately.

DISCLOSURE OF INVENTION

It is a general object of the present invention to provide a bit-rate discrimination circuit capable of accurately discriminate the bit-rate of an input signal even if the high frequency component of the input signal is lost.

Another object of the present invention is to provide a multi bit-rate reception circuit using the above bit-rate discrimination circuit.

A bit-rate discrimination circuit for determining which bit-rate an input signal has, a first bit-rate or a second bit-rate higher than the first bit-rate, the circuit is characterized by:

a frequency selection unit configured to filter out a signal having the second bit-rate, and allow at least a fraction of the low frequency component of a signal having the first bit-rate to pass through;

a determination unit configured to determine whether the fraction of the low frequency component of the signal having the first bit-rate has passed through the frequency selection unit;

a smoothing unit configured to smooth the output of the determination unit; and a level conversion unit configured to convert the output of the smoothing unit to a logic level.

The frequency selection unit filters out a signal having the second bit-rate higher than the first bit-rate, and allows at least a fraction of the low frequency component of a signal having the first bit-rate to pass through. The determination unit determines the presence of the fraction of the low frequency component of the signal having the first bit-rate that has passed through the frequency selection unit. The smoothing unit smoothes the output of the determination unit, and the level conversion unit converts the output of the smoothing unit to a logic level. According to the above arrangements, the bit-rate discrimination circuit can discriminate the bit-rate of an input signal based on the low frequency component thereof.

According to an embodiment of the present invention, the frequency selection unit may be an integrator; the determination unit may be a hysteresis comparator; the smoothing unit may be an integrator; and the level conversion unit may be a comparator.

According to another aspect of the present invention, a multi bit-rate reception circuit capable of adjusting sensitivity thereof for each one of a plurality of bit-rates, is characterized by:

a preamplifier configured to amplify an input signal;

a main amplifier configured to amplify the output signal from the preamplifier to constant amplitude; wherein the bit-rate discrimination circuit as claimed in claim 1, configured to adjust the bandwidth and gain of the preamplifier based on a signal amplified by the preamplifier and the main amplifier.

The bit-rate discrimination circuit can determine whether the bit-rate of the input signal is the first bit-rate or not, and adjust the gain and bandwidth of the preamplifier.

Other objects, features and advantages of the present invention will become more apparent from the following detailed description when read in conjunction with the accompanying drawings.

DESCRIPTION OF REFERENCE NUMERALS AND LETTERS

1 INPUT TERMINAL
2 OUTPUT TERMINAL
3 DELAY CIRCUIT
4 EXCLUSIVE OR CIRCUIT
5 MEAN VALUE DETECTOR
6 LEVEL DECISION CIRCUIT
7 REFERENCE VOLTAGE INPUT TERMINAL
8 VARIABLE GAIN/BANDWIDTH PREAMPLIFIER
9 GAIN/BANDWIDTH CONTROL TERMINAL
10 LIMITING AMPLIFIER
11 BIT-RATE DISCRIMINATION CIRCUIT
12, 13 DIFFERENTIAL OUTPUT TERMINAL
14 FIRST STAGE INTEGRATOR
15 HYSTERESIS COMPARATOR
16 SECOND STAGE INTEGRATOR
17 COMPARATOR
18 REFERENCE VOLTAGE INPUT TERMINAL
19 HYSTERESIS COMPARATOR HAVING THE SAME BANDWIDTH AS FIRST STAGE INTEGRATOR
20 COMPARATOR HAVING THE SAME BANDWIDTH AS SECOND STAGE INTEGRATOR
21 INPUT TERMINAL (NON-INVERTED)
22 INPUT TERMINAL (INVERTED)
23 DIFFERENTIAL HYSTERESIS COMPARATOR
24 NON-INVERTED OUTPUT TERMINAL OF DIFFERENTIAL HYSTERESIS COMPARATOR 23
25 INVERTED OUTPUT TERMINAL OF DIFFERENTIAL HYSTERESIS COMPARATOR 23
26 TERMINATOR
27 DIFFERENTIAL HYSTERESIS COMPARATOR HAVING THE SAME BANDWIDTH AS FIRST STAGE INTEGRATOR 14
28 SINGLE END AMPLIFIER
29 DIFFERENTIAL OUTPUT BUFFER
30, 31 FEEDBACK RESISTOR
32 VOLTAGE-CONTROLLED SWITCH OR SWITCH ELEMENT
33 REFERENCE VOLTAGE INPUT TERMINAL
34, 35 BIT-RATE DISCRIMINATION CIRCUIT
36 D/A CONVERTER
37 VARIABLE RESISTOR OR RESISTOR ELEMENT
38 BRANCH OR DISTRIBUTION CIRCUIT
39 N INPUT D/A CONVERTER
A INPUT SIGNAL WAVEFORM
B OUTPUT WAVEFORM OF DUAL INPUT EXCLUSIVE OR CIRCUIT
C OUTPUT WAVEFORM OF MEAN-VALUE DETECTOR
D OUTPUT WAVEFORM OF LEVEL DECISION CIRCUIT
A1 INPUT WAVEFORM OF LOW BIT-RATE
A2 INPUT WAVEFORM OF HIGH BIT-RATE
B1 OUTPUT WAVEFORM OF FIRST STAGE INTEGRATOR 14 (LOW BIT-RATE INPUT)
B2 OUTPUT WAVEFORM OF FIRST STAGE INTEGRATOR 14 (HIGH BIT-RATE INPUT)
C1 OUTPUT WAVEFORM OF HYSTERESIS COMPARATOR 15 (LOW BIT-RATE INPUT)

C2 OUTPUT WAVEFORM OF HYSTERESIS COMPARATOR 15 (HIGH BIT-RATE INPUT)
D1 OUTPUT WAVEFORM OF SECOND STAGE INTEGRATOR 16 (LOW BIT-RATE INPUT)
D2 OUTPUT WAVEFORM OF SECOND STAGE INTEGRATOR 16 (HIGH BIT-RATE INPUT)
E1 OUTPUT WAVEFORM OF COMPARATOR 17 (LOW BIT-RATE INPUT)
E2 OUTPUT WAVEFORM OF COMPARATOR 17 (HIGH BIT-RATE INPUT)
F1 OUTPUT WAVEFORM OF HYSTERESIS COMPARATOR 19 HAVING THE SAME BANDWIDTH AS FIRST STAGE INTEGRATOR 14 (LOW BIT-RATE INPUT)
F2 OUTPUT WAVEFORM OF HYSTERESIS COMPARATOR 19 HAVING THE SAME BANDWIDTH AS FIRST STAGE INTEGRATOR 14 (HIGH BIT-RATE INPUT)
G1 OUTPUT WAVEFORM OF COMPARATOR 20 HAVING THE SAME BANDWIDTH AS SECOND STAGE INTEGRATOR 16 (LOW BIT-RATE INPUT)
G2 OUTPUT WAVEFORM OF COMPARATOR 20 HAVING THE SAME BANDWIDTH AS SECOND STAGE INTEGRATOR 16 (HIGH BIT-RATE INPUT)

BEST MODE FOR CARRYING OUT THE INVENTION

The best mode for carrying out the invention is described in detail below with reference to the attached drawings.

First Embodiment

The bit-rate discrimination circuits according to a first embodiment of the present invention and its variations are described with reference to FIGS. 1-8.

Figure 1:
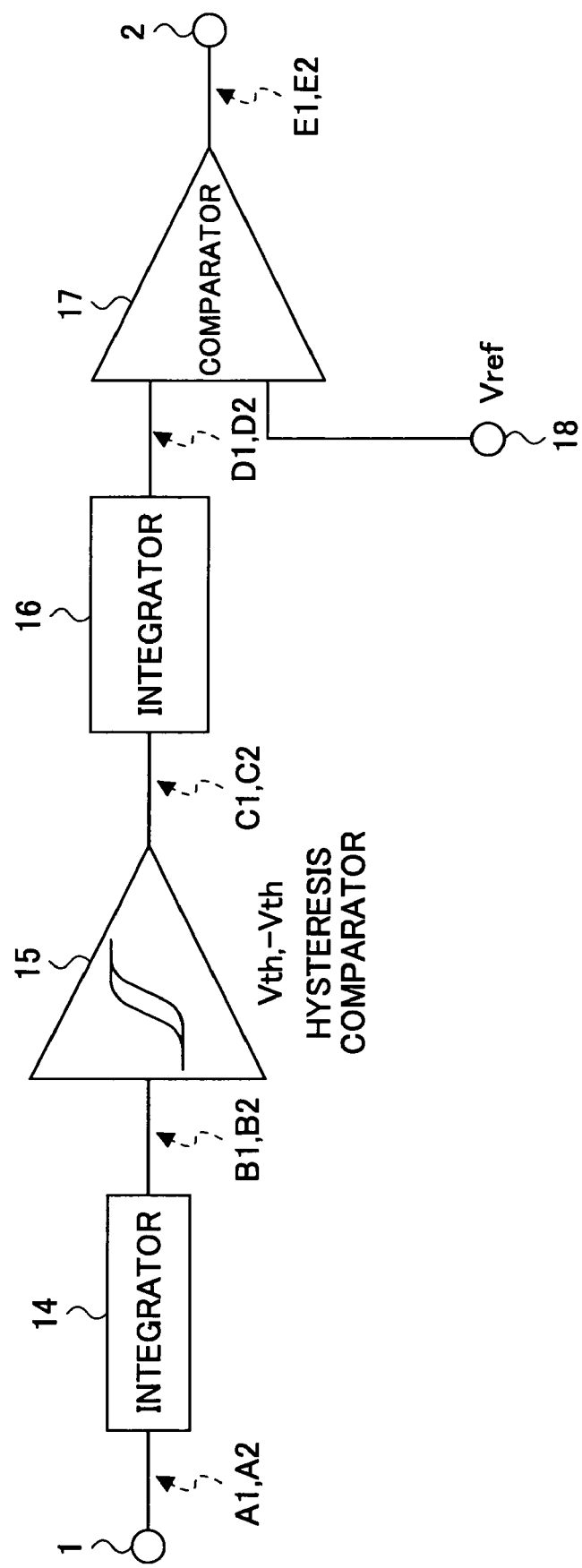
FIG. 1 is a block diagram showing a bit-rate discrimination circuit according to a first embodiment of the present invention.

FIG. 1 is a block diagram showing a bit-rate discrimination circuit according to a first embodiment of the present invention. In FIG. 1, a reference numeral 1 denotes an input terminal; 14 denotes a first stage integrator (a low pass filter, for example); 15 denotes a hysteresis comparator having threshold values $V_{th}$ and $-V_{th}$; 16 denotes a second stage integrator (a low pass filter, for example); 17 denotes a comparator; 18 denotes a reference voltage ($V_{ref}$) input terminal; and 2 denotes an output terminal.

Figure 2:
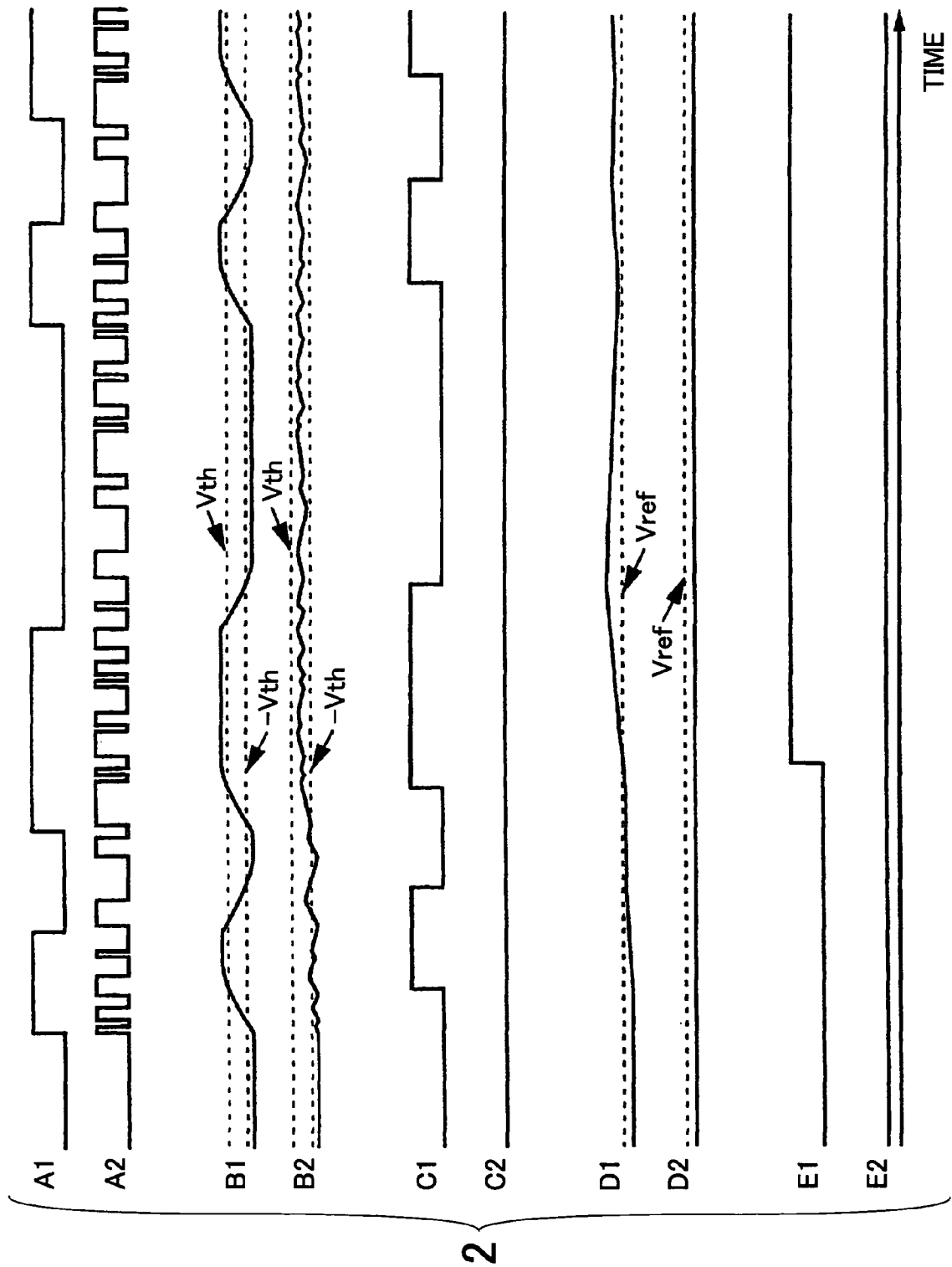
FIG. 2 is a waveform diagram for explaining the operation of the bit-rate discrimination circuit of FIG. 1.

FIG. 2 is a waveform diagram for explaining the operation of the bit-rate discrimination circuit of FIG. 1. In FIG. 2, waveform A1 is that of a low bit-rate input signal fed to the input terminal 1. Waveform A2 is that of a high bit-rate input signal fed to the input terminal 1. Waveform B1 is that of an output signal from the first stage integrator 14 in the case the low bit-rate input signal A1 is fed to the input terminal 1. Waveform B2 is that of an output signal from the first stage integrator 14 in the case the high bit-rate input signal A2 is fed to the input terminal 1. Similarly, waveform C1 is that of an output signal from the hysteresis comparator 15 in the case the low bit-rate input signal A1 is fed to the input terminal 1. Waveform C2 is that of an output signal from the hysteresis comparator 15 in the case the high bit-rate input signal A2 is fed to the input terminal 1. Further, waveform D1 is that of an output signal from the second stage integrator 16 (in the case a low bit-rate signal is fed), and waveform D2 is that of an output signal from the second stage integrator 16 (in the case a high bit-rate signal is fed). Waveform E1 is that of an output signal from the comparator 17 (in the case a low bit-rate signal is fed), and waveform E2 is that of an output signal from the comparator 17 (in the case a high bit-rate signal is fed).

The input signal A1 or A2 is fed to the first stage integrator 14. The first stage integrator 14 has such frequency characteristics that the high bit-rate input signal is filtered out, and the low frequency component of the low bit-rate input signal, at least partially, passes through the first stage integrator 14. According to the above arrangement, in the case in which the low bit-rate signal is fed, and especially when an input signal indicating consecutive identical digits having low frequency component is fed, the output signal B1 has sufficiently great amplitude although rise and fall edges become dull. In the case in which the high bit-rate signal is fed, however, the output signal B2 does not have great amplitude because the output signal from the first stage integrator 14 stays around the center voltage of the input signal.

The hysteresis comparator 15 is also called as Schmidt trigger circuit, and has two threshold values $V_{th}$ and $-V_{th}$. If the input signal is higher than $V_{th}$, the hysteresis comparator 15 outputs a high voltage, and if the input signal is lower than $-V_{th}$, the hysteresis comparator 15 outputs a low voltage. If the input signal is between $V_{th}$ and $-V_{th}$, the output from the hysteresis comparator 15 does not change. Thus, if the output signal B1 from the first stage integrator 14 in the case of the low bit-rate signal is fed, the output from the hysteresis comparator 15 switches between high and low frequently as shown in the waveform C1. If the output signal B2 from the first stage integrator 14 in the case of the high bit-rate signal is fed, the output from the hysteresis comparator 15 remains low as shown in the waveform C2 because the output signal B2 does not exceeds the threshold value $V_{th}$ of the hysteresis comparator 15.

The second stage integrator 16 has such frequency characteristics that the low bit-rate signal does not pass through but is integrated. When the input signal C1 or C2 is fed to the second stage integrator 16, the average of the input signal is output. As shown in the waveform D1, when the low bit-rate signal is fed, the output of the hysteresis comparator 15 switches between high and low, the average of the input signal is output. On the other hand, when the high bit-rate signal is fed, since the output signal (C2) of the hysteresis comparator 15 remains at a low voltage, the second stage integrator 16 outputs a low voltage (output signal D2).

The reference voltage ($V_{ref}$) of the comparator 17 is determined such that the increase of the output voltage D1 from the second integrator 16 caused in the case of a low bit-rate input signal is detected adequately. When the signal D1 is fed to the comparator 17, and exceeds the reference voltage ($V_{ref}$), the output signal E1 from the comparator 17 turns to a high level. However, when the signal D2 is fed to the comparator 17, the signal D2 does not exceed the reference voltage ($V_{ref}$), the output signal E2 remains at a low level. Consequently, the bit-rate of the input signal can be discriminated.

The first stage integrator has such bandwidth that the high bit-rate signal is filtered out, but at least a fraction of the low frequency component of the low bit-rate signal passes through the first stage integrator. Thus, if the bit-rate of the input signal is high, the output signal from the first stage integrator has small amplitude, and if the bit-rate of the input signal is low, the output signal from the first stage integrator has great amplitude. The bit-rate of the input signal is discriminated by using the difference in the amplitude of the output signal from the first stage integrator. Specifically, the output signal from the first stage integrator is fed to a hysteresis comparator that does not react to a small amplitude input signal but reacts to a great amplitude input signal. The output signal from the hysteresis comparator is averaged by the second stage integrator that has lower bandwidth. The averaged signal is at a low voltage for the high bit-rate input signal, and is at a high voltage for the low bit-rate input signal. The output signal from the second stage integrator is fed to the comparator for comparing it with the reference voltage. The output signal from the comparator can be used as a result of discrimination. The above method discriminates the bit-rate of an input signal by determining the presence of the low frequency component of the input signal. Therefore, the bit-rate of the input signal can be accurately discriminated even if the high frequency component of the input signal is not available.

Figure 3:
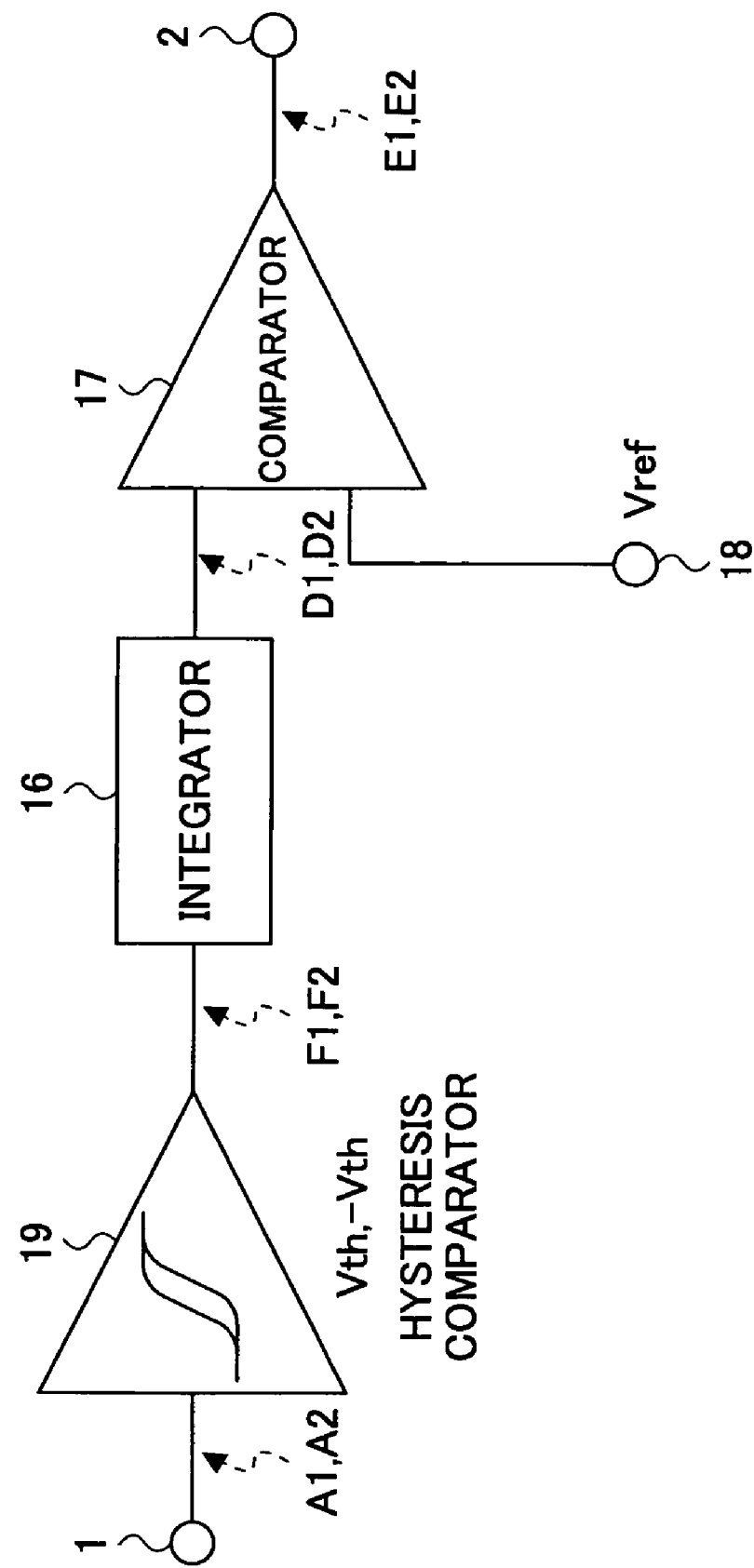
FIG. 3 is a block diagram showing a bit-rate discrimination circuit according to a first variation of the first embodiment.

FIG. 3 is a block diagram showing a bit-rate discrimination circuit according to a first variation of the first embodiment. The same reference numerals as FIG. 1 indicate similar components. A reference numeral 19 denotes a hysteresis comparator having the threshold values $V_{th}$ and $-V_{th}$, and having the same frequency characteristics as the first stage integrator 14.

Figure 4:
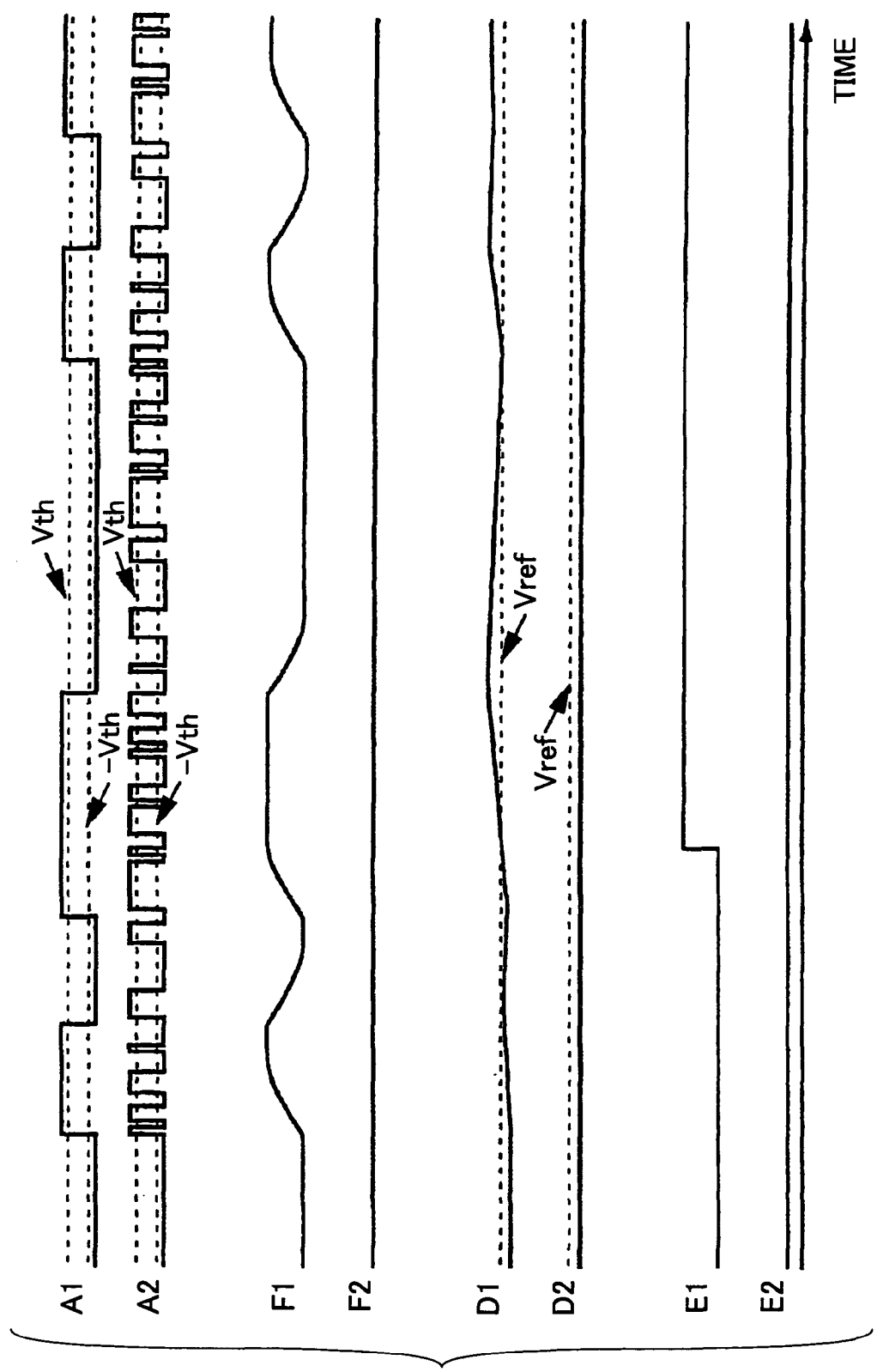
FIG. 4 is a waveform diagram for explaining the operation of the bit-rate discrimination circuit of FIG. 3.

FIG. 4 is a waveform diagram for explaining the operation of the bit-rate discrimination circuit of FIG. 3. The same reference marks as FIG. 2 denote the same components. A reference mark F1 denotes the output waveform of the hysteresis comparator 19 in the case in which the low bit-rate signal as shown in A1 is fed to the input terminal 1. F2 denotes the output waveform of the hysteresis comparator 19 in the case in which the high bit-rate signal as shown in A2 is fed to the input terminal 1.

In the present variation, the first stage integrator 14 is omitted, and the hysteresis comparator 19 that has the same frequency characteristics as the first stage integrator 14 is used. Although the input signal (A1, A2) has a sufficient amplitude, the slow response hysteresis comparator 19 can respond to the low bit-rate input signal and switch its output between a high level and a low level, but the slow response hysteresis can not respond to the high bit-rate input signal and remains at a low level. The other portion of the bit-rate discrimination circuit is the same as that of the first embodiment shown in FIG. 1. It will be understood that the bit-rate discrimination circuit according to the first variation of the first embodiment operates in the same manner as that of the first embodiment shown in FIG. 1.

Figure 5:
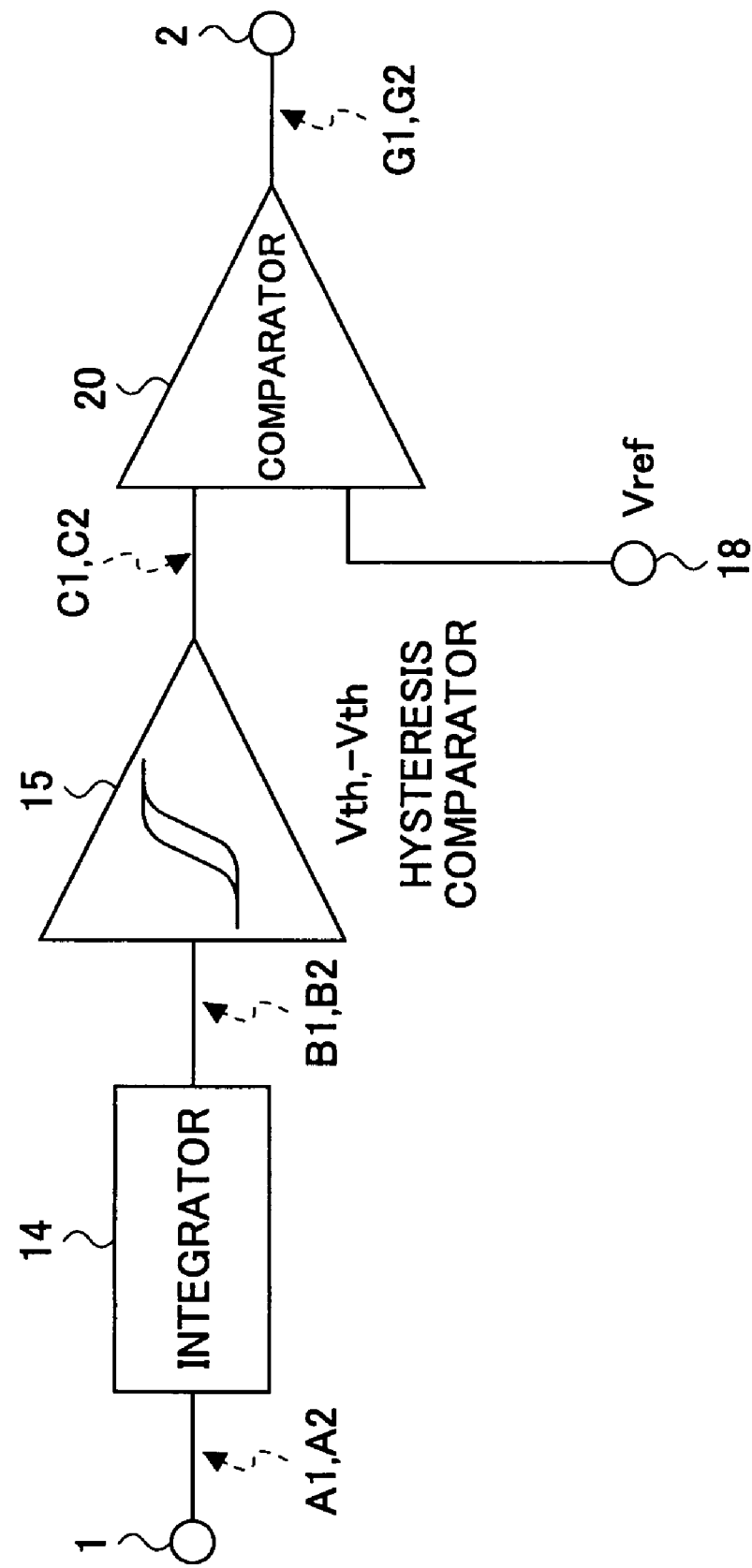
FIG. 5 is a block diagram showing a bit-rate discrimination circuit according to a second variation of the first embodiment.
Figure 6:
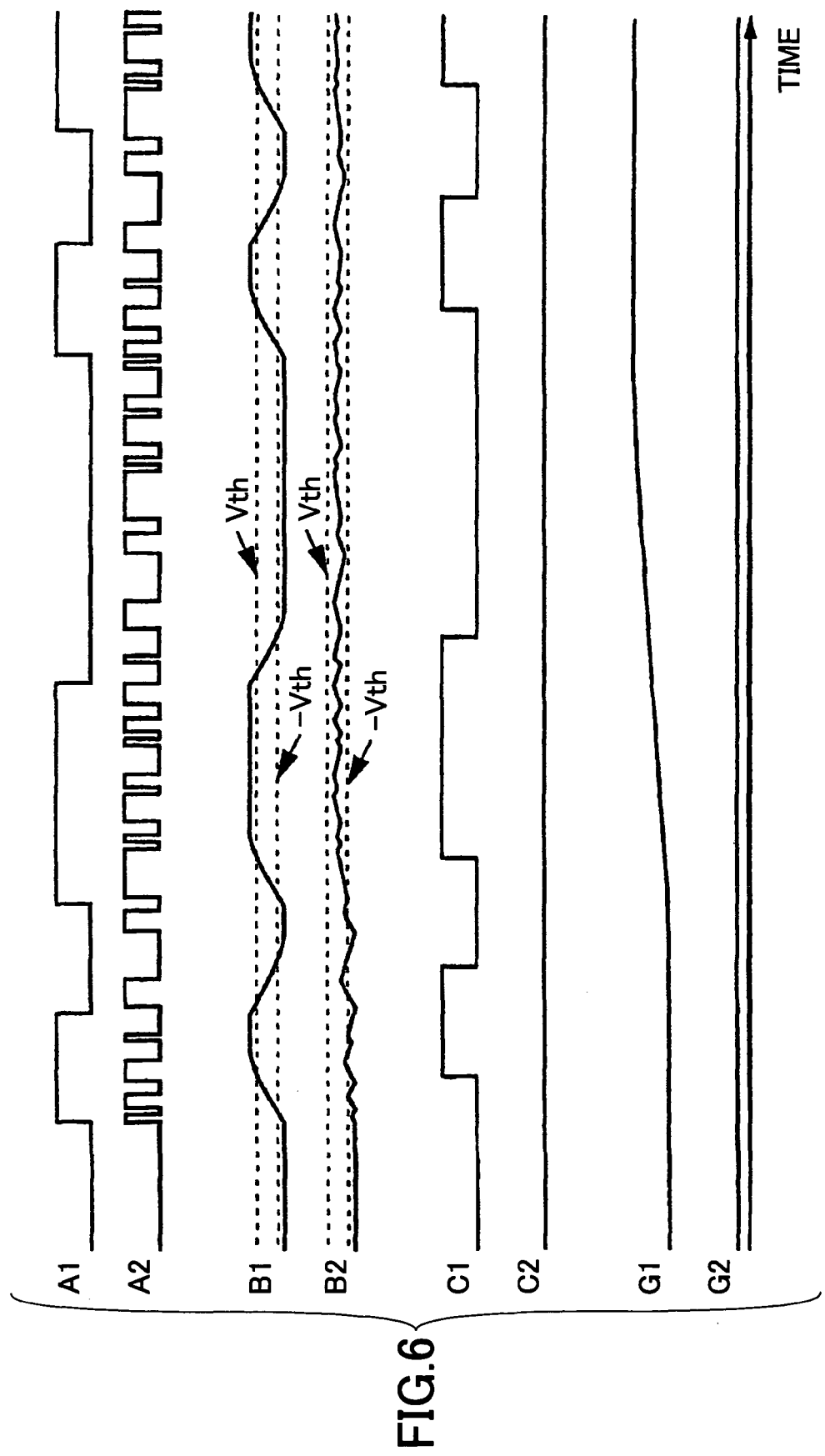
FIG. 6 is a waveform diagram for explaining the operation of the bit-rate discrimination circuit of FIG. 5.

FIG. 5 is a block diagram showing a bit-rate discrimination circuit according to a second variation of the first embodiment. The same reference numerals as FIG. 1 indicate similar components. A reference numeral 20 denotes a comparator having the same frequency characteristics as the second stage integrator 16. FIG. 6 is a waveform diagram for explaining the operation of the bit-rate discrimination circuit of FIG. 5. The same reference marks as FIG. 2 denote the same components. A reference mark G1 denotes the output waveform of the comparator 20 in the case in which the low bit-rate signal as shown in A1 is fed to the input terminal 1. G2 denotes the output waveform of the comparator 20 in the case in which the high bit-rate signal as shown in A2 is fed to the input terminal 1.

In the present variation, the second stage integrator 16 is omitted, and the comparator 20 that has the same frequency characteristics as the second stage integrator 16 is used. Because the comparator 20 can not quickly respond to the output signal from the hysteresis comparator 15, a steady discrimination result can be obtained. Consequently, the same discrimination result as the first embodiment and the second variation of the first embodiment can be obtained.

Figure 7:
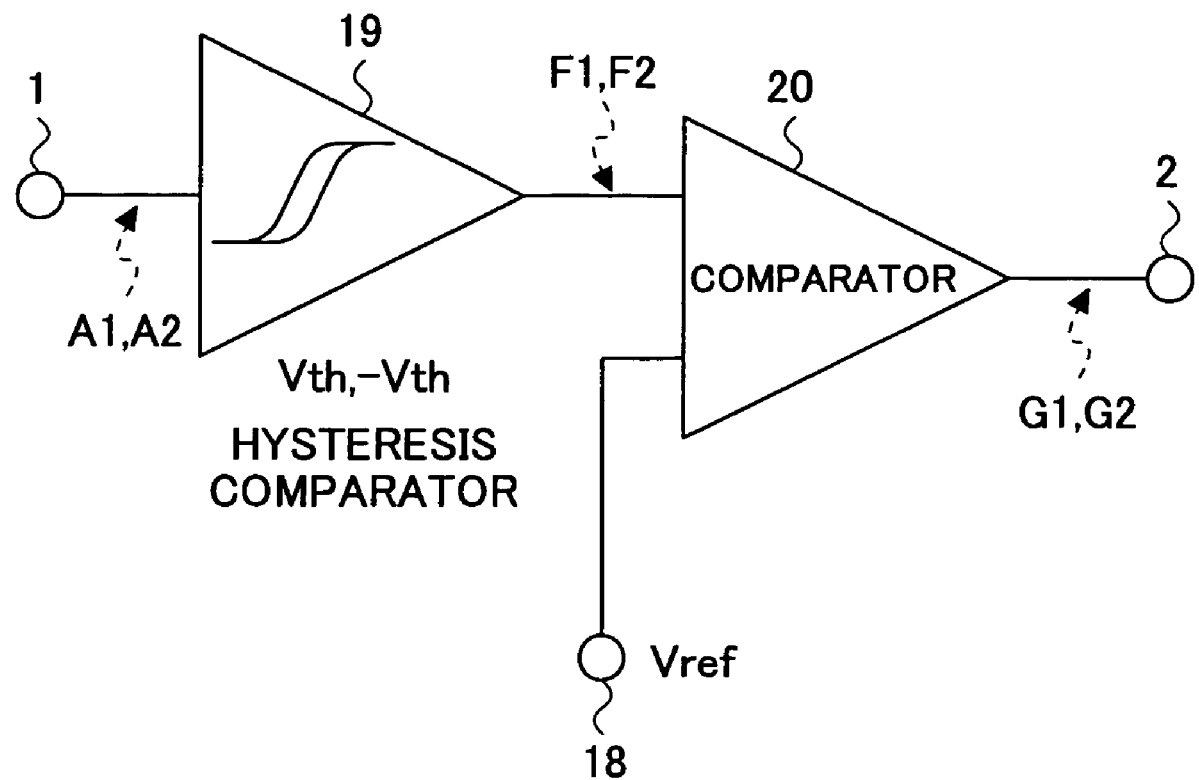
FIG. 7 is a block diagram showing a bit-rate discrimination circuit according to a third variation of the first embodiment.

FIG. 7 is a block diagram showing a bit-rate discrimination circuit according to a third variation of the first embodiment. The same reference numerals as FIGS. 3 and 5 indicate similar components.

Figure 8:
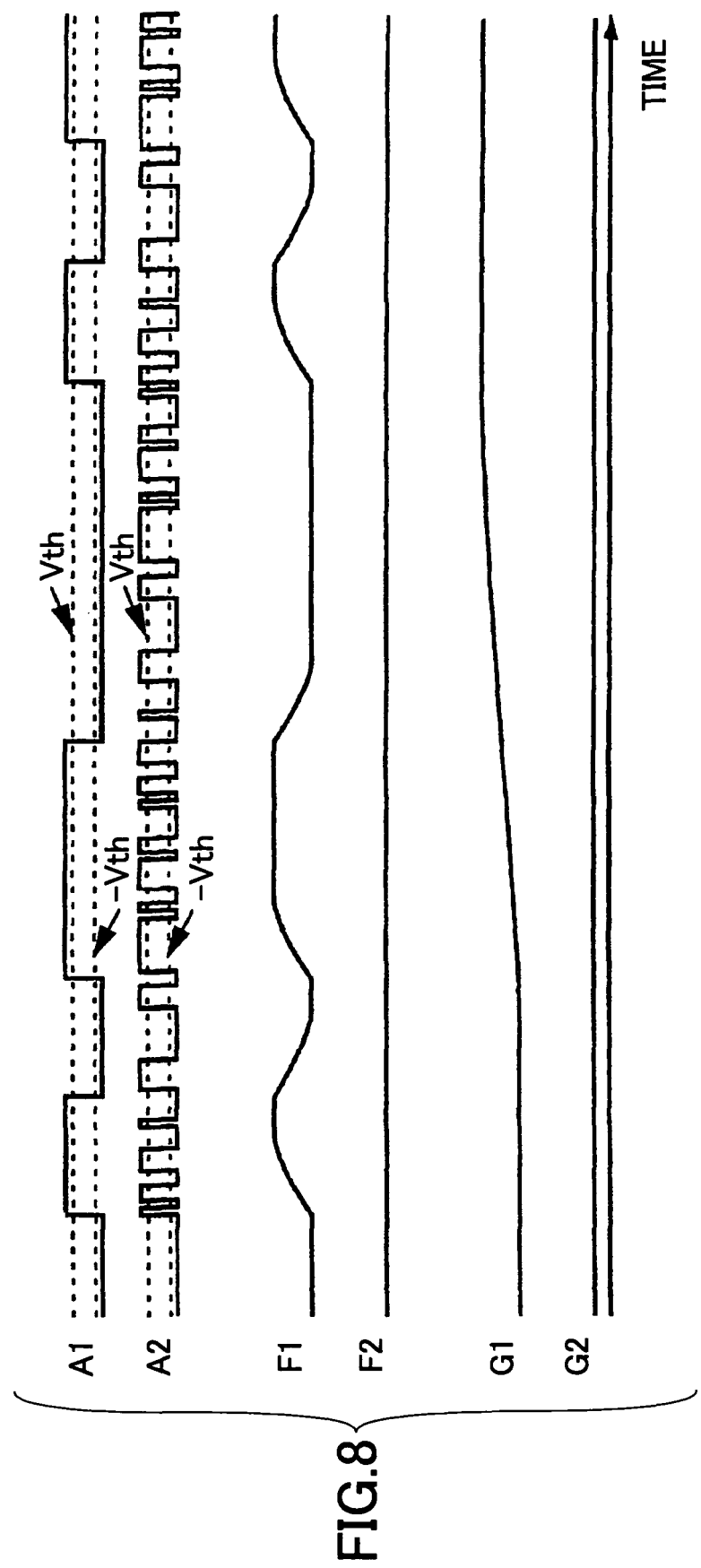
FIG. 8 is a waveform diagram for explaining the operation of the bit-rate discrimination circuit of FIG. 7.

FIG. 8 is a waveform diagram for explaining the operation of the bit-rate discrimination circuit of FIG. 7. The same reference marks as FIGS. 4 and 6 denote the same components. The operation of the bit-rate discrimination circuit according to the present variation is apparent based on the corresponding description of the variations of FIGS. 3 and 5. The same discrimination result as the first embodiment can be obtained.

Second Embodiment

Bit-rate discrimination circuits according to a second embodiment of the present invention and its variations are described with reference to FIGS. 9-12.

Figure 9:
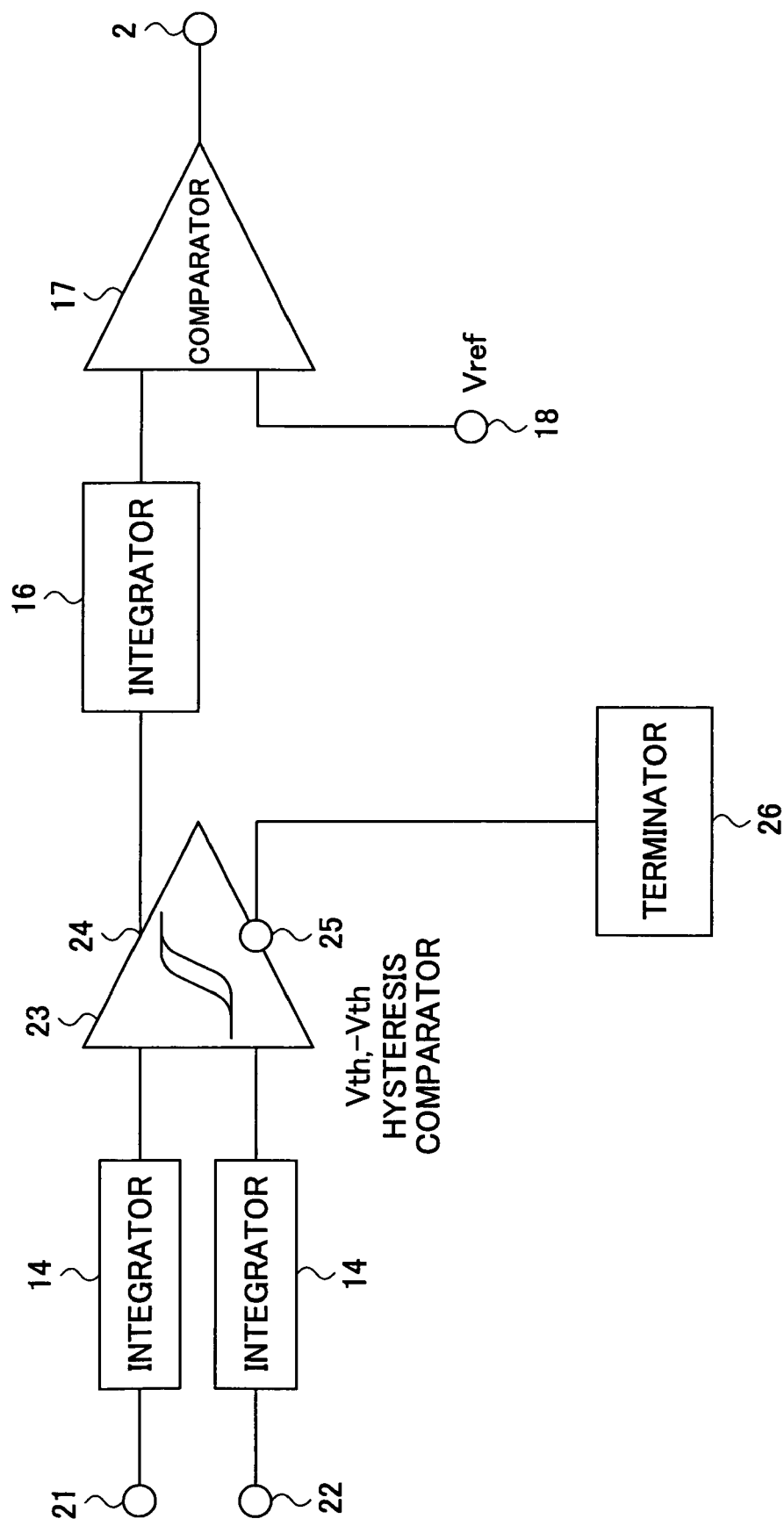
FIG. 9 is a block diagram showing a bit-rate discrimination circuit according to a second embodiment of the present invention.

FIG. 9 is a block diagram showing a bit-rate discrimination circuit according to the second embodiment. The same reference numerals as FIG. 1 indicate similar components. A reference numeral 21 denotes an input terminal (non-inverted input); 22 denotes an input terminal (inverted input); 23 denotes a differential hysteresis comparator; 24 denotes a non-inverted output terminal of the differential hysteresis comparator 23; 25 denotes an inverted output terminal of the differential hysteresis comparator 23; and 26 denotes a terminator. The bit-rate discrimination circuit according to the second embodiment uses the differential hysteresis comparator 23, and the first stage integrator 14 is connected to each of the differential input terminals 21 and 22. The non-inverted output terminal 24 of the differential hysteresis comparator 23 is connected to the second stage integrator 16. It will be understood that the bit-rate discrimination circuit according to the second embodiment operates in the same manner as the first embodiment.

Figure 10:
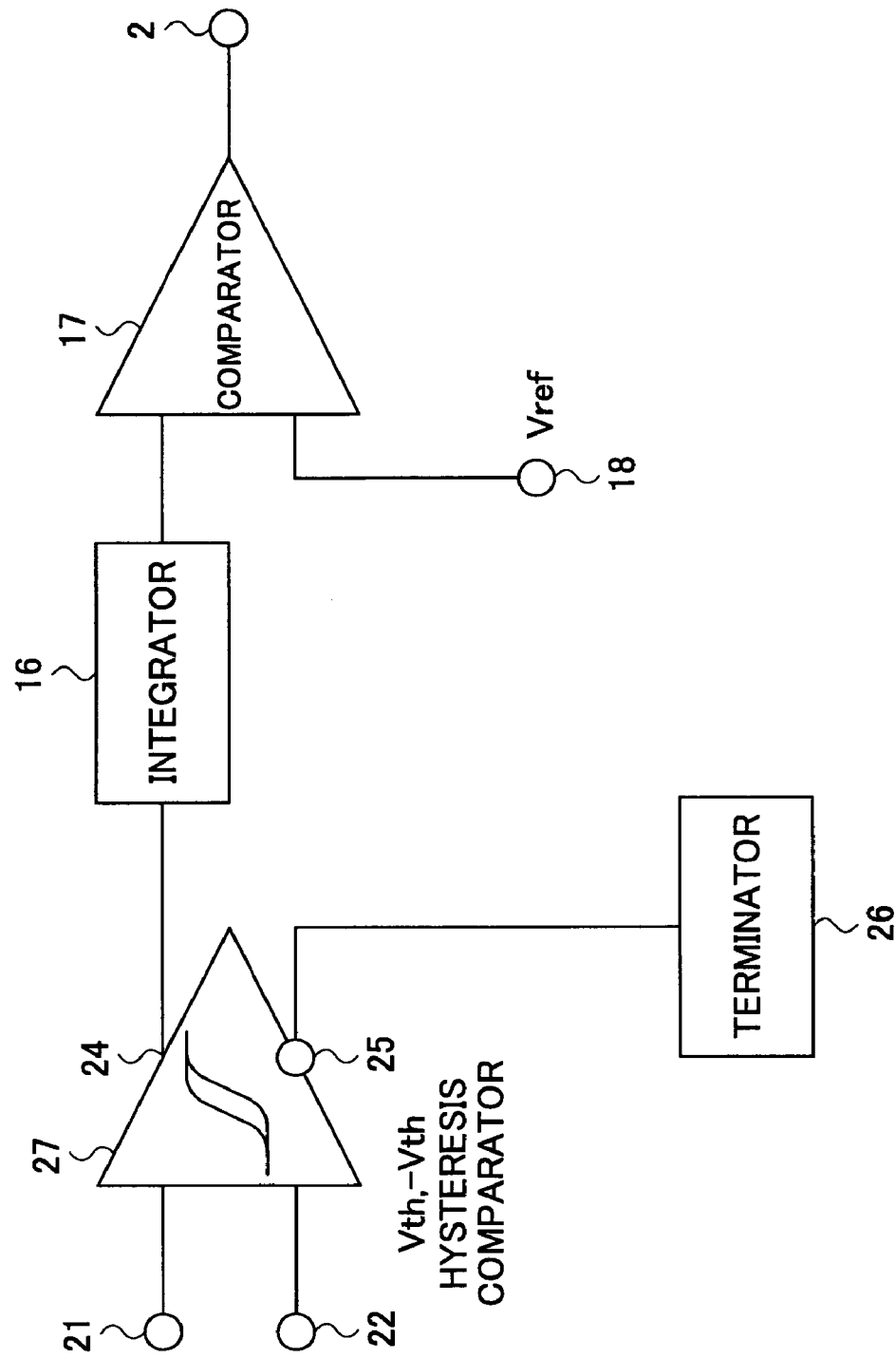
FIG. 10 is a block diagram showing a bit-rate discrimination circuit according to a first variation of the second embodiment.

FIG. 10 is a block diagram showing a bit-rate discrimination circuit according to a first variation of the second embodiment. The same reference numerals as FIG. 9 indicate similar components. A reference numeral 27 denotes a differential hysteresis comparator having threshold values $V_{th}$ and $-V_{th}$, and having the same frequency characteristics as the first stage integrator 14. The bit-rate discrimination circuit according to the present variation is based on the circuit of FIG. 9 modified in accordance with the same design concept as the circuit of FIG. 3, and operates in the same manner as the second embodiment.

Figure 11:
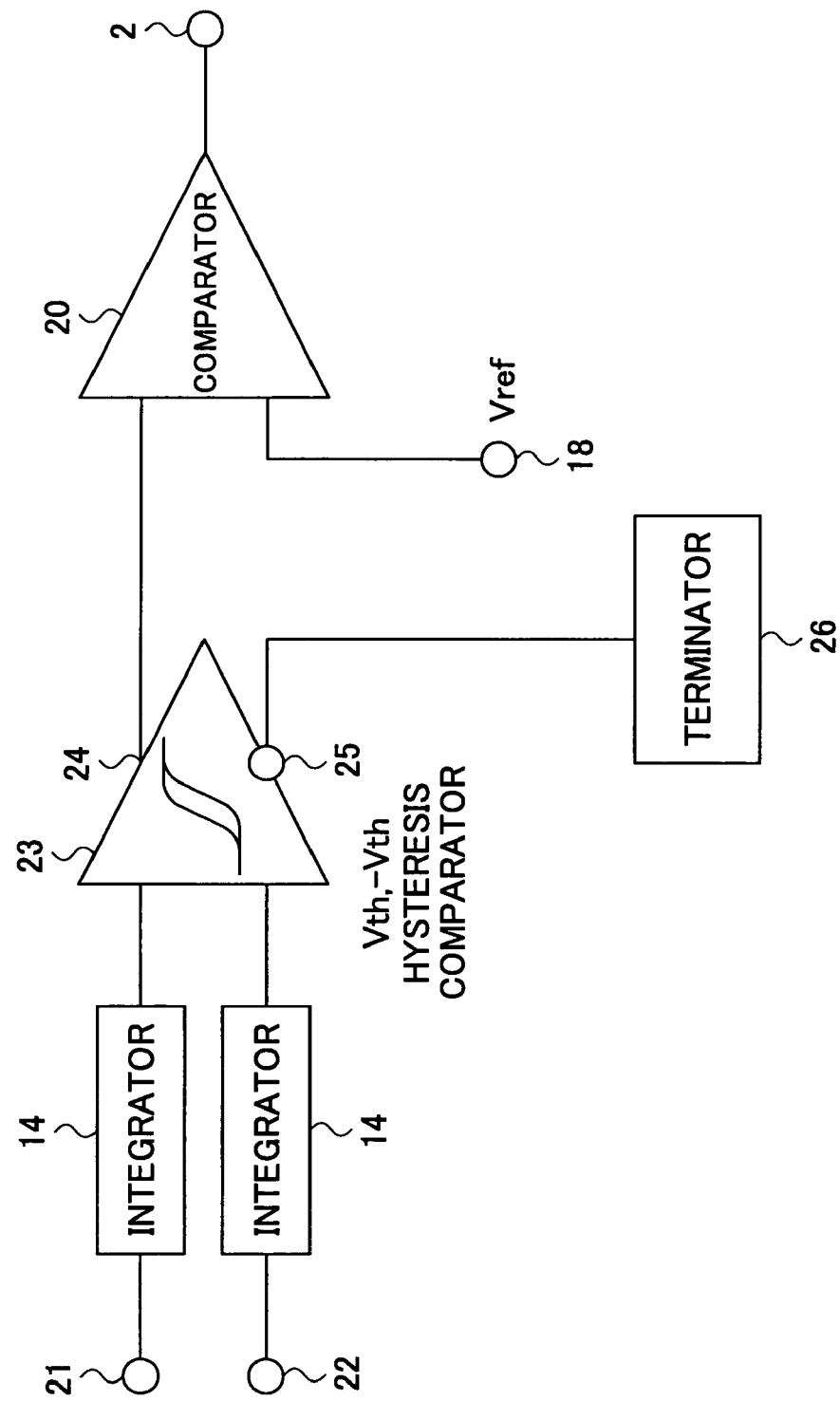
FIG. 11 is a block diagram showing a bit-rate discrimination circuit according to a second variation of the second embodiment.

FIG. 11 is a block diagram showing a bit-rate discrimination circuit according to a second variation of the second embodiment. The same reference numerals as FIGS. 5 and 9 indicate similar components. The bit-rate discrimination circuit according to the present variation is based on the circuit of FIG. 9 modified in accordance with the same design concept as the circuit of FIG. 5, and operates in the same manner as the second embodiment.

Figure 12:
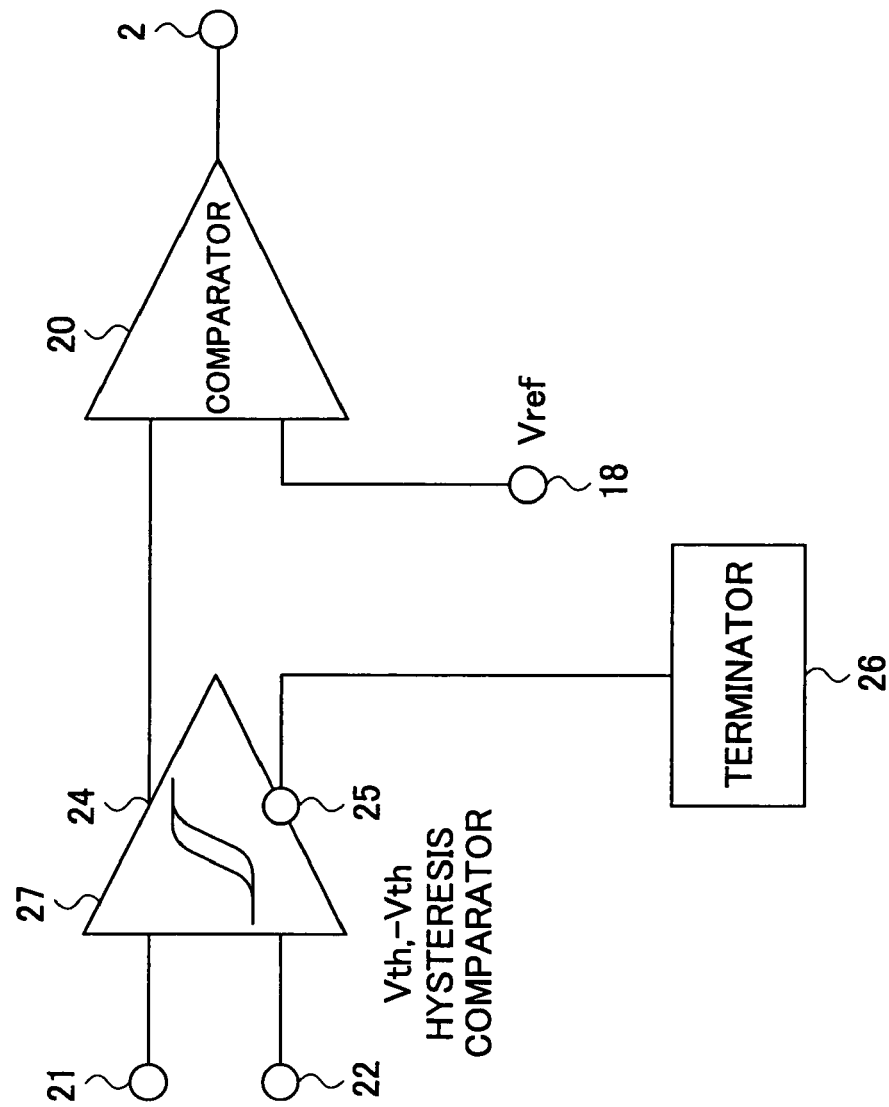
FIG. 12 is a block diagram showing a bit-rate discrimination circuit according to a third variation of the second embodiment.

FIG. 12 is a block diagram showing a bit-rate discrimination circuit according to a third variation of the second embodiment. The same reference numerals as FIGS. 10 and 11 indicate similar components. The bit-rate discrimination circuit according to the present variation is based on the circuit of FIG. 9 modified in accordance with the same design concept as the circuit of FIG. 7, and operates in the same manner as the second embodiment.

The first and second stage integrators 14 and 16, the hysteresis comparator 15, the comparator 17, the differential hysteresis comparator 23, the terminator 26 used in the bit-rate discrimination circuits described above are any suitable circuits that operate as described above. The terminator 26 may not be necessarily used in the bit-rate discrimination circuits shown in FIGS. 9-12, and may be omitted. Furthermore, in the bit-rate discrimination circuit shown in FIGS.

9-12, one of the input terminals 21 or 22 of the differential hysteresis comparator 23 may be used as a reference voltage input terminal. In such a case, the first stage integrator connected to the reference voltage input terminal may be omitted.

As described above, the bit-rate discrimination circuits according to the first and second embodiments and their variations can accurately discriminate the bit-rate of an input signal even if the high frequency component of the input signal is not available because the discrimination is made based on the presence of the low frequency component of the input signal. According to the above arrangements, even if the upper limit frequency of the front end circuit of the bit-rate discrimination circuit is lowered due to the feedback of the discrimination result, adjustments can be performed accurately.

Third Embodiment

Multi bit-rate reception circuits according to a third embodiment and its variations are described with reference to FIGS. 13 and 14.

Figure 13:
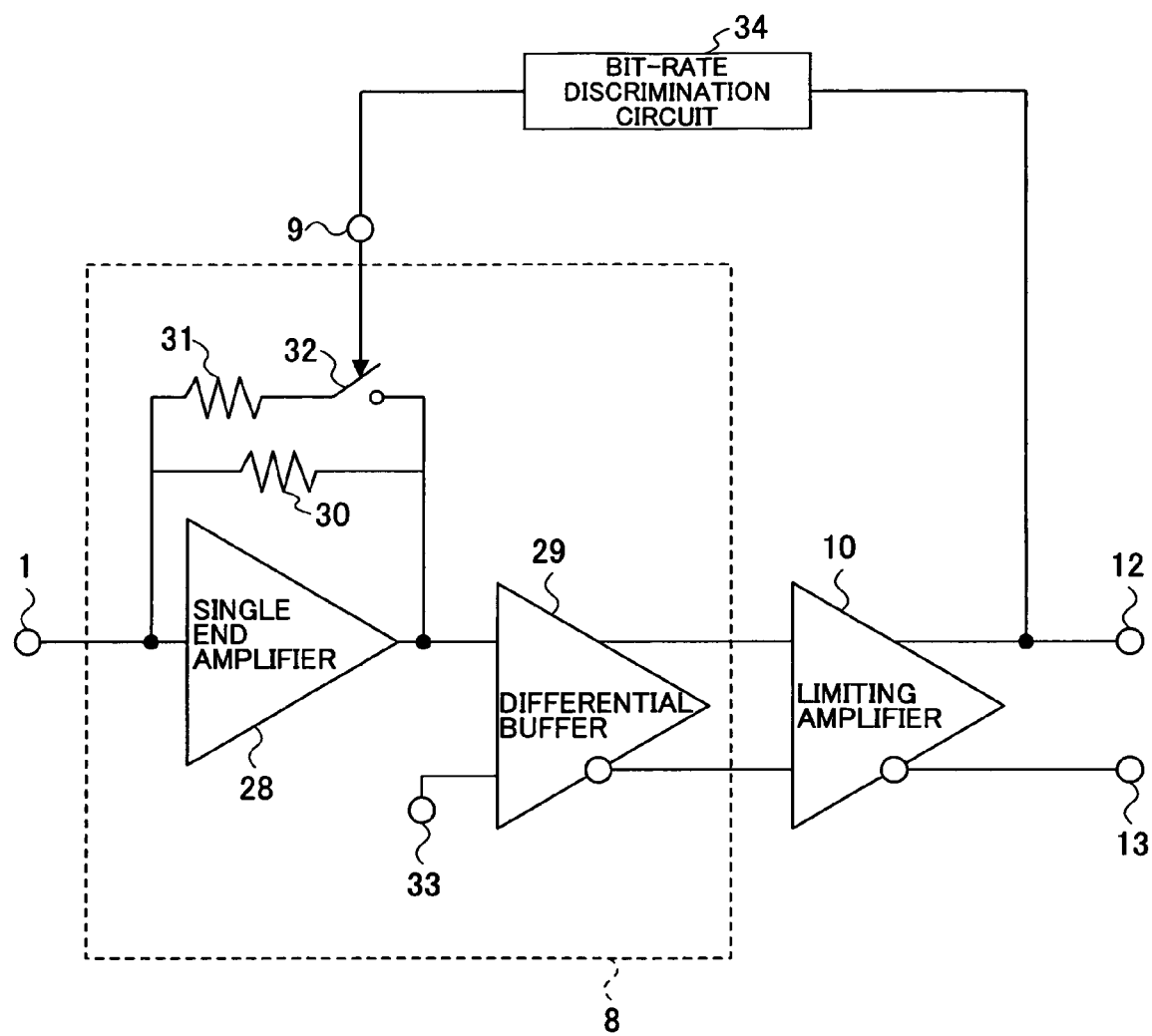
FIG. 13 is a block diagram showing a multi bit-rate reception circuit according to a third embodiment of the present invention using the bit-rate discrimination circuit according to the first embodiment.

FIG. 13 is a block diagram showing a multi bit-rate reception circuit using the bit-rate discrimination circuit according to the first embodiment or its variations. This multi bit-rate reception circuit is provided with a variable gain/bandwidth preamplifier whose gain and bandwidth can be adjusted by a digital signal. In FIG. 13, a reference numeral 1 denotes an input terminal; 9 denotes a control terminal for controlling gain and bandwidth; 28 denotes a single end amplifier; 29 denotes a differential output buffer; 30 and 31 denote feedback resistors; 32 denotes a voltage-controlled switch or switch element; 33 denotes a reference voltage input terminal; 34 denotes the bit-rate discrimination circuit according to the first embodiment or its variations; 10 denotes a limiting amplifier; and 12 and 13 denote differential output terminals.

The gain and bandwidth of the variable gain/bandwidth preamplifier 8 can be adjusted by the feedback resistor 31 and the voltage-controlled switch of switch element connected in series, both connected to the feedback resistor 30 in parallel. In the case where the bit-rate discrimination circuit 34 outputs a high level for the low bit-rate input signal and a low level for the high bit-rate input signal, for example, if the switch or switch element 32 is switched off for a high level signal and switched on for a low level signal, the switch or switch element 32 can adjust the gain and bandwidth of the single end preamplifier 28.

Figure 14:
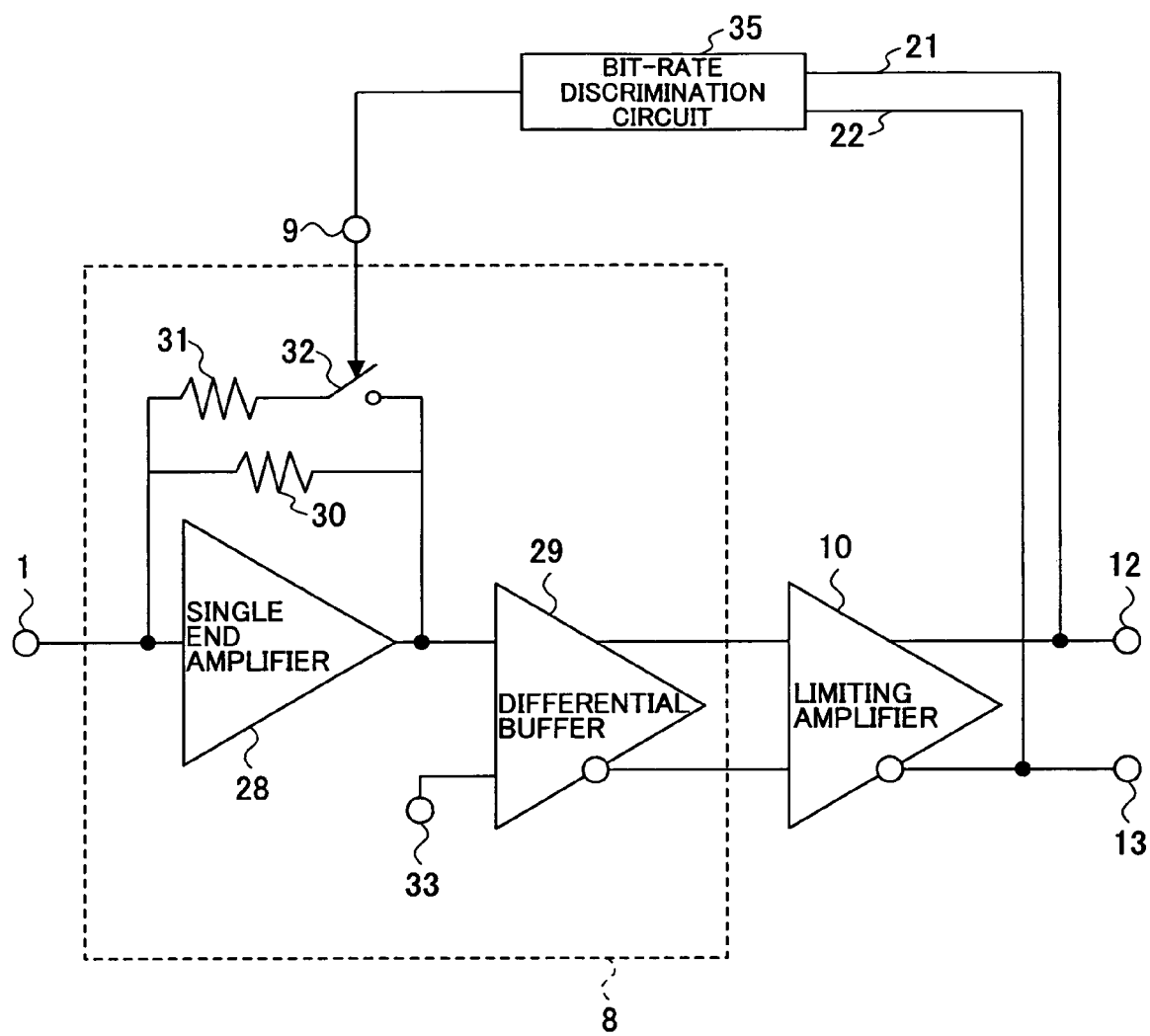
FIG. 14 is a block diagram showing a multi bit-rate reception circuit according to a variation of the third embodiment using the bit-rate discrimination circuit according to the second embodiment.

FIG. 14 is a block diagram showing a multi bit-rate reception circuit using the bit-rate discrimination circuit according to the second embodiment or its variations. In FIG. 14, reference numerals 1-13 denote similar components to those of FIG. 13; 21 and 22 denote similar components to those of FIG. 9; and 28-32 denote similar components to those of FIG. 13. A reference numeral 35 denotes the bit-rate discrimination circuit according to the second embodiment or its variations. The multi bit-rate reception circuit in this case can operate in the same manner as that of FIG. 13 by connecting the input terminal 21 to the non-inverted output terminal 12 of the limiting amplifier 10, and the input terminal 22 to the inverted output terminal 13.

Fourth Embodiment

Figure 15:
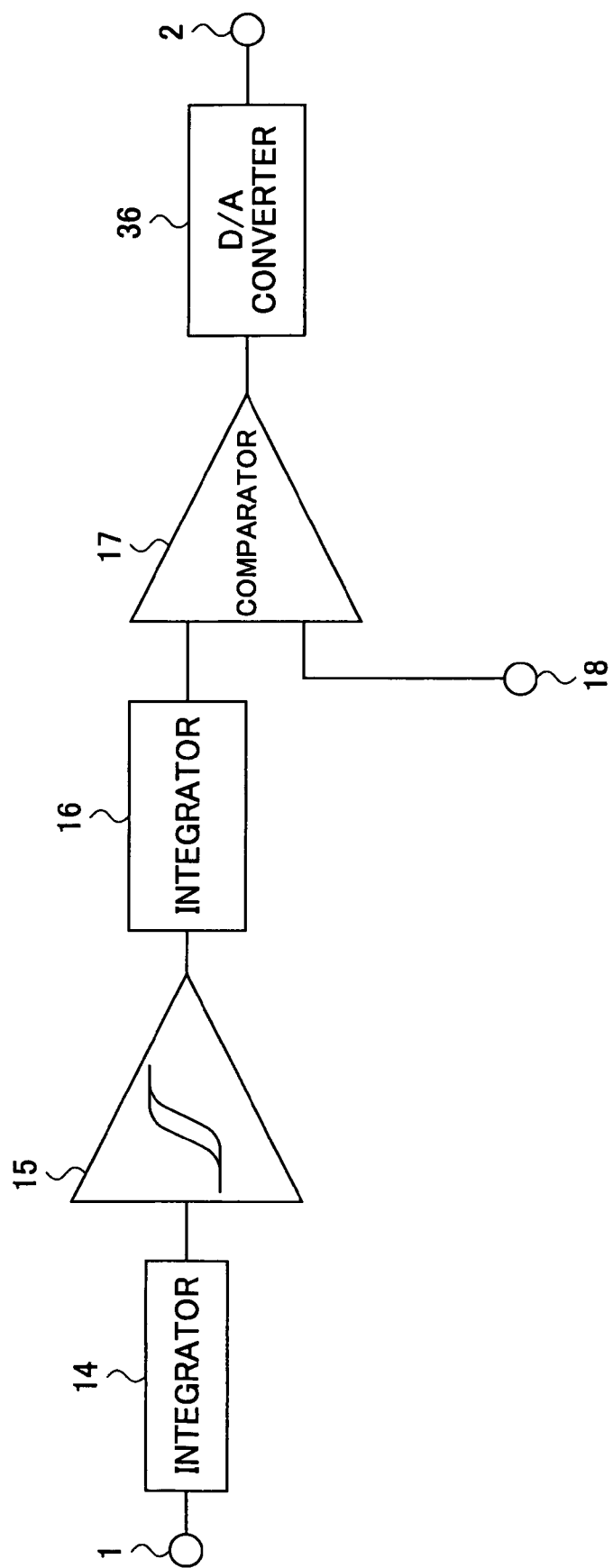
FIG. 15 is a block diagram showing a bit-rate discrimination circuit according to a fourth embodiment of the present invention.

Bit-rate discrimination circuit according to a fourth embodiment and its variations are described below with reference to FIGS. 15 and 16. Reference numerals 1-18 denote the similar components shown in FIG. 1; and 36 denotes a D/A converter. For convenience, FIG. 15 shows the bit-rate discrimination circuit according to the first embodiment to which the D/A converter 36 is attached, but the D/A converter 36 may be connected to the bit-rate discrimination circuits according to the variations of the first embodiment. According to the present embodiment, the feedback control of the variable gain/bandwidth preamplifier of which gain and bandwidth can be adjusted by an analog signal is realized by converting the logical value indicating the discrimination result into an analog signal using the D/A converter 36.

Figure 16:
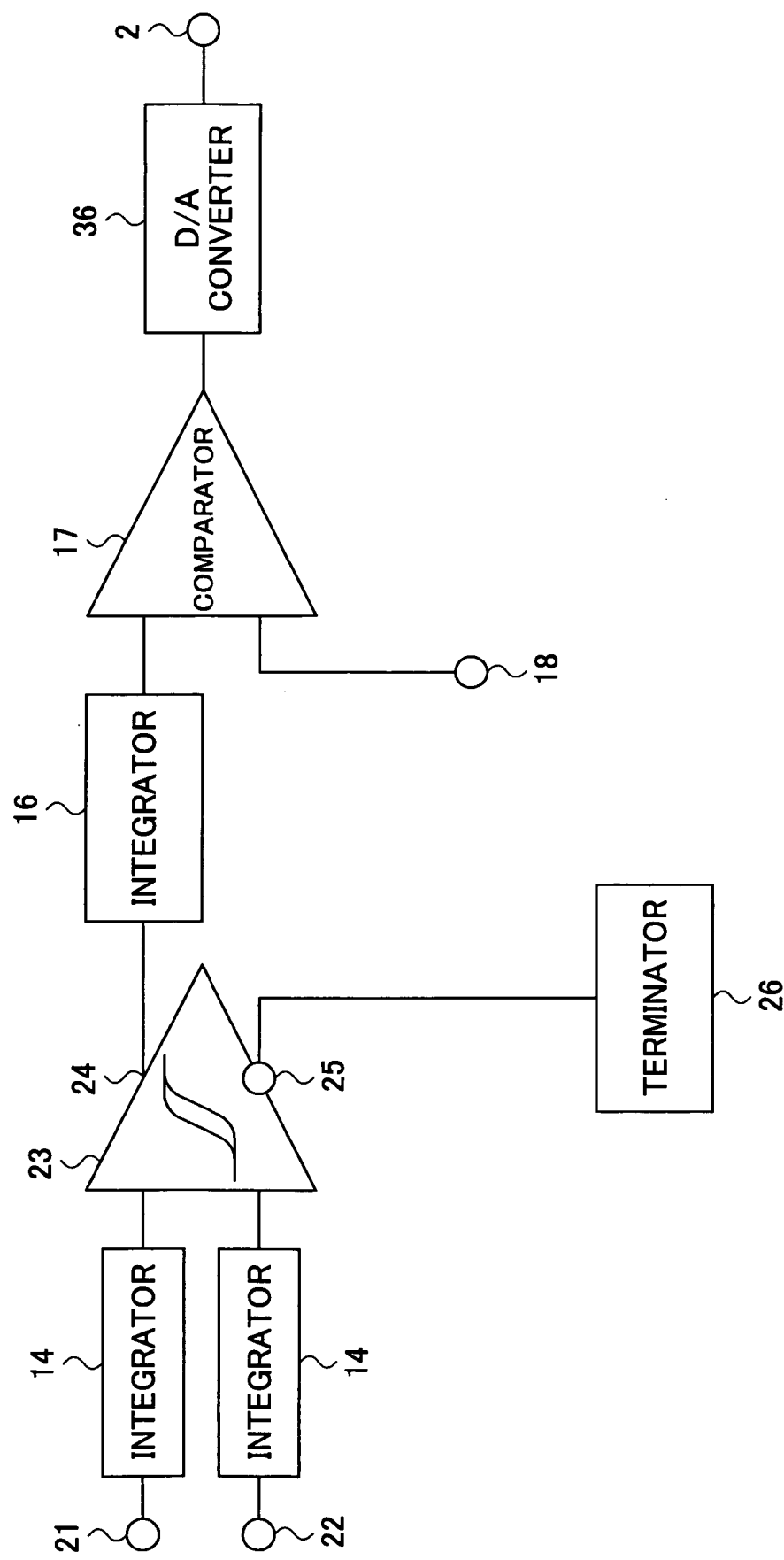
FIG. 16 is a block diagram showing a bit-rate discrimination circuit according to a variation of the fourth embodiment.

FIG. 16 is a block diagram showing a bit-rate discrimination circuit according to a variation of the fourth embodiment. Reference numerals 1-26 denote similar components to those shown in FIG. 9; and 36 denotes similar components to that shown in FIG. 15. For convenience, FIG. 16 shows the bit-rate discrimination circuit according to the second embodiment to which the D/A converter 36 is connected. However, the D/A converter 36 may be connected to the bit-rate discrimination circuits according to the variations of the second embodiment. The circuit according to the present variation is a differential input type discrimination circuit, which is usable to adjust the variable gain/bandwidth preamplifier (see FIG. 18) of which gain and bandwidth can be adjusted by an analog signal input as the bit-rate discrimination circuit according to the fourth embodiment.

Fifth Embodiment

Multi bit-rate reception circuits according to a fifth embodiment and its variations are described below with reference to FIGS. 17 and 18.

Figure 17:
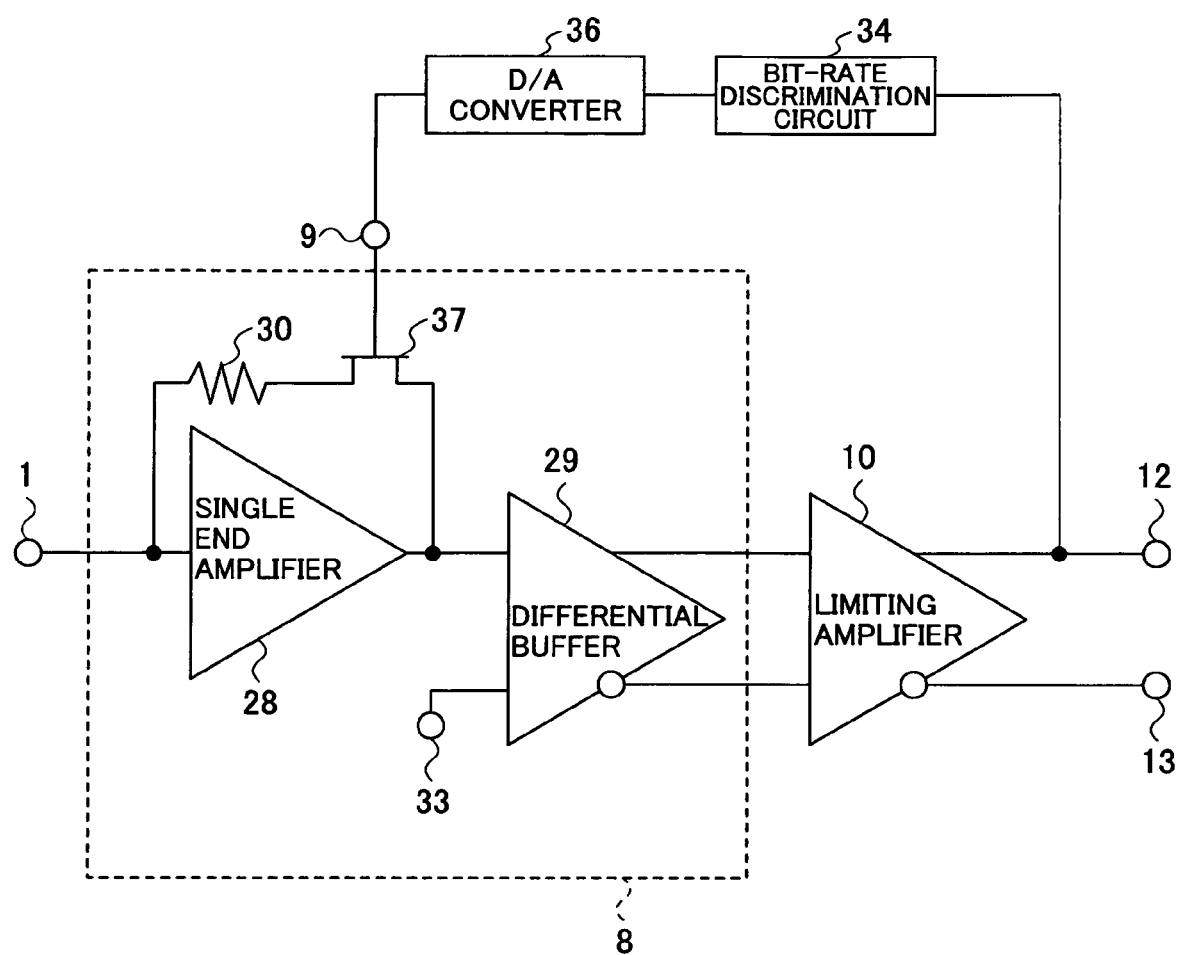
FIG. 17 is a block diagram showing a multi bit-rate reception circuit according to a fifth embodiment of the present invention using the bit-rate discrimination circuit of FIG. 15.

FIG. 17 is a block diagram showing a multi bit-rate reception circuit according to a fifth embodiment using the bit-rate discrimination circuit according to the fourth embodiment. In FIG. 17, reference numerals 1-34 denote similar components to those shown in FIG. 13; 36 denotes a similar component to that shown in FIG. 15; and 37 denotes a variable resistor or resistor element. The resistance of the variable resistor or resistor element 37 continuously changes as a voltage or current that is input to the gain/bandwidth control terminal 9. It will be understood that, although the variable resistor or resistor element 37 is indicated using a symbol of FET, the variable resistor or resistor element 37 may be a bipolar transistor or any suitable device that has similar functionality. According to the above arrangements, the gain and bandwidth of the variable gain/bandwidth preamplifier 8 can be adjusted in a continuous fashion to the input of an analog signal. If the circuit is designed such that the output voltage of the D/A converter 36 is adjusted, and the variable gain/bandwidth preamplifier 8 has desired gain and bandwidth to the logical value indicating the discrimination result before D/A conversion, the same function as the multi bit-rate reception circuit according to the third embodiment shown in FIG. 13 can be achieved.

Figure 18:
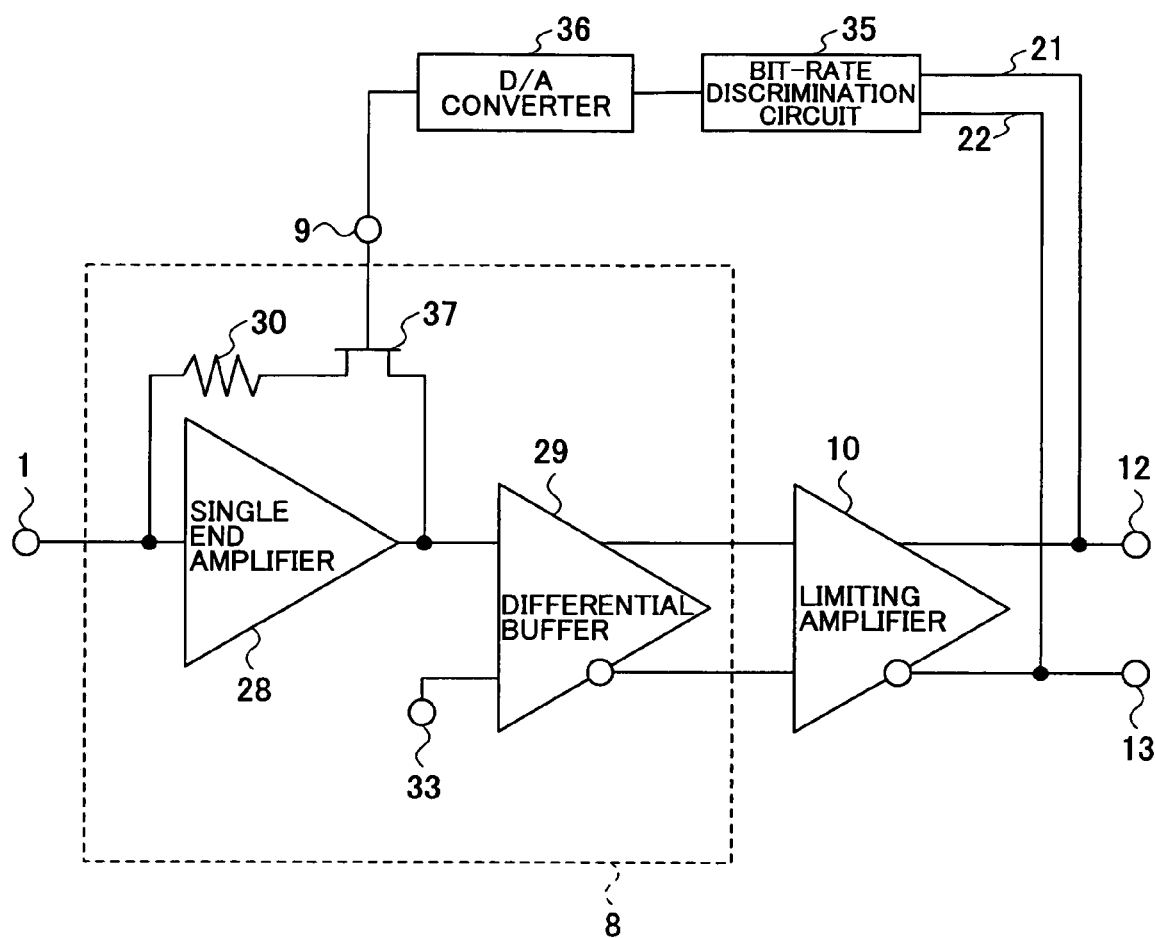
FIG. 18 is a block diagram showing a multi bit-rate reception circuit according to a variation of the fifth embodiment using the bit-rate discrimination circuit of FIG. 16.

FIG. 18 is a block diagram showing a multi bit-rate reception circuit according to a variation of the fifth embodiment using the bit-rate discrimination circuit according to the variation of the fourth embodiment. If the bit-rate discrimination circuit 35 according to the second embodiment is used, the same functionality as the circuit shown in FIG. 14 can be achieved by connecting the input terminals 21 and 22 to the non-inverted output terminal 12 and the inverted output terminal 13, respectively, of the limiting amplifier 10.

Sixth Embodiment

Figure 19:
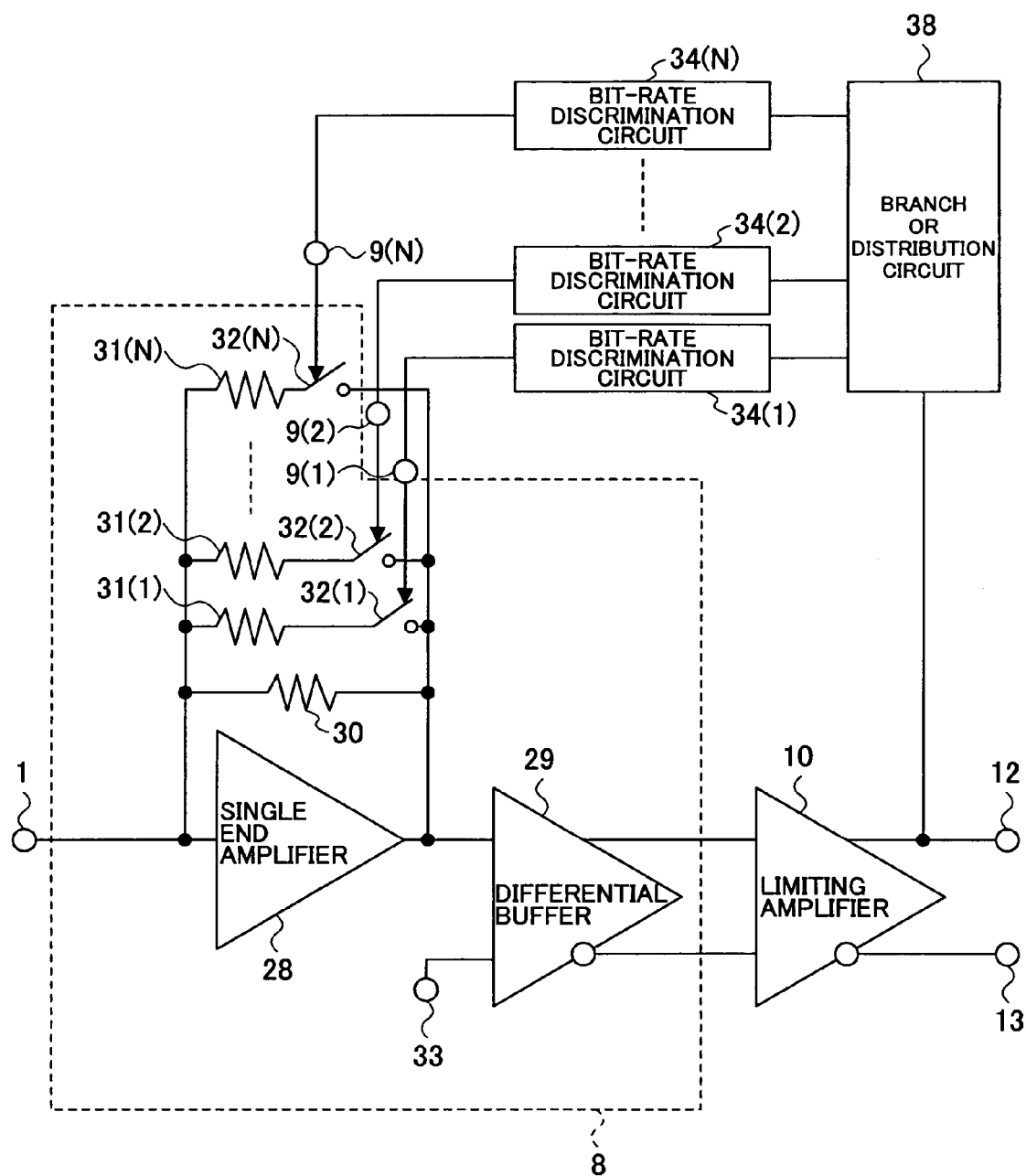
FIG. 19 is a block diagram showing a multi bit-rate reception circuit according to a sixth embodiment of the present invention.

FIG. 19 is a block diagram showing a multi bit-rate reception circuit capable of discriminating more than two bit-rates using the bit-rate discrimination circuit according to the present invention. In FIG. 19, reference numerals 1-34 denote the similar components to those shown in FIG. 13; and 38 denotes a branch or distribution circuit. N sets of gain/bandwidth control terminals 9, feedback resistors 31, voltage-controlled switches or switch elements 32, bit-rate discrimination circuits 34 according to the first embodiment or its variation are used, and each set is identified by an index in parentheses. It is noted that the switch 32 may be current-controlled type. Since the N bit-rate discrimination circuits according to the first embodiment or its variations and N combinations of feedback resistors 31 and voltage-controlled switches or switch elements 32 for switching the feedback resistor of the variable gain/bandwidth preamplifier 8 are used, the circuit can discriminate N+1 bit-rates. For example, assume that the N+1 bit-rates are BR(1), BR(2), ..., BR(N), BR(N+1), in order of increasing; the bit-rate discrimination circuit 34(1) can discriminate BR(1) and BR(2); the bit-rate discrimination circuit 34(2) can discriminate BR(2) and BR(3); ... ; the bit-rate discrimination circuit 34(N) can discriminate BR(N) and BR(N+1). If a signal having a bit-rate BR(K) is input, the bit-rate discrimination circuits 34(K)-34(N) determines that the bit-rate of the input signal is low, and the bit-rate discrimination circuits 34(1)-34(K−1) determines that the bit-rate of the input signal is high. In the case where the output of the bit-rate discrimination circuit 34 is a high level for the low bit-rate input and a low level for the high bit-rate input, if the switch or switch element 32 is a component that is turned off for the high level input and turned on for the low level input, the multi bit-rate reception circuit according to the sixth embodiment can adjust its gain and bandwidth in dependence on the N+1 bit-rates.

Although FIG. 19 shows the multi bit-rate reception circuit in which the bit-rate discrimination circuits 34 according to the first embodiment or its variations are connected in parallel, the bit-rate discrimination circuit 35 according to the second embodiment or its variations may be used. In such a case, a differential type branch or distribution circuit 38 may be used, the differential input terminals of which are connected to the output terminals 12 and 13 of the limiting amplifier 10 as shown in FIG. 14.

Seventh Embodiment

Figure 20:
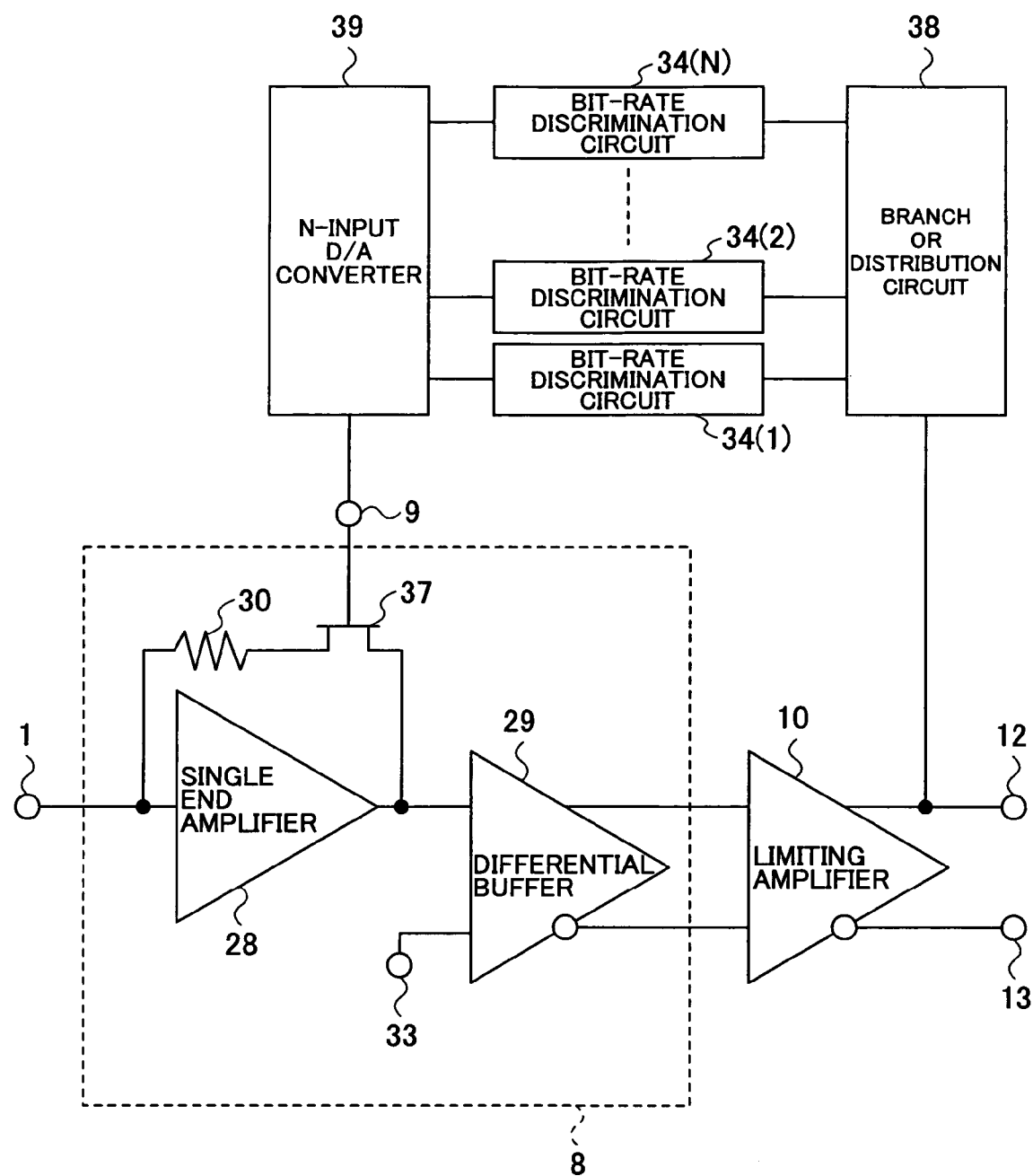
FIG. 20 is a block diagram showing a multi bit-rate reception circuit according to a seventh embodiment of the present invention.
Figure 21:
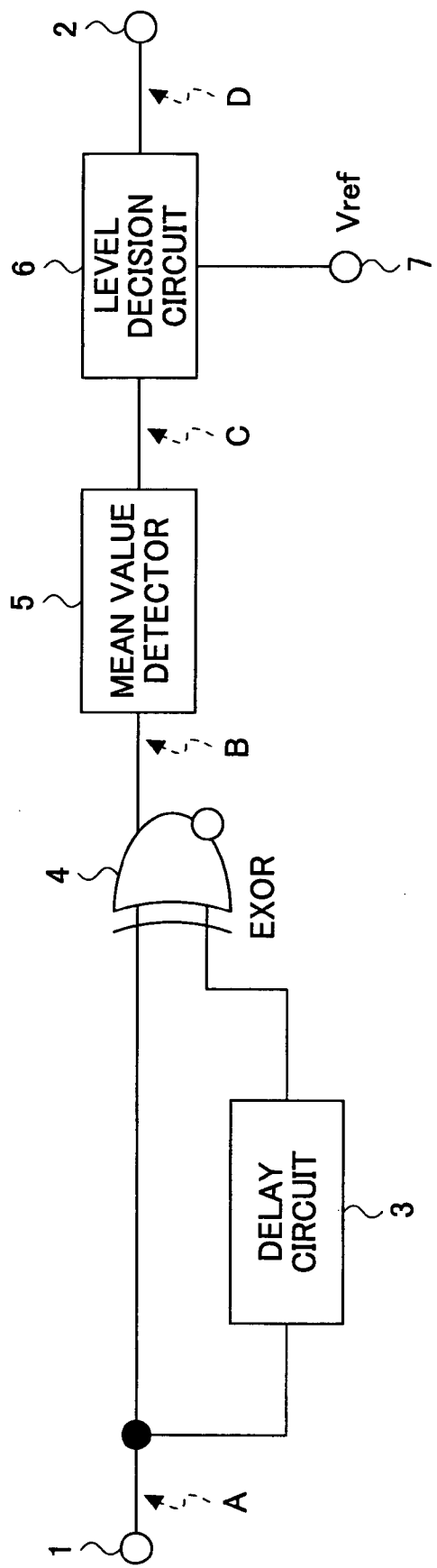
FIG. 21 is a block diagram showing a conventional bit-rate discrimination circuit.
Figure 22:
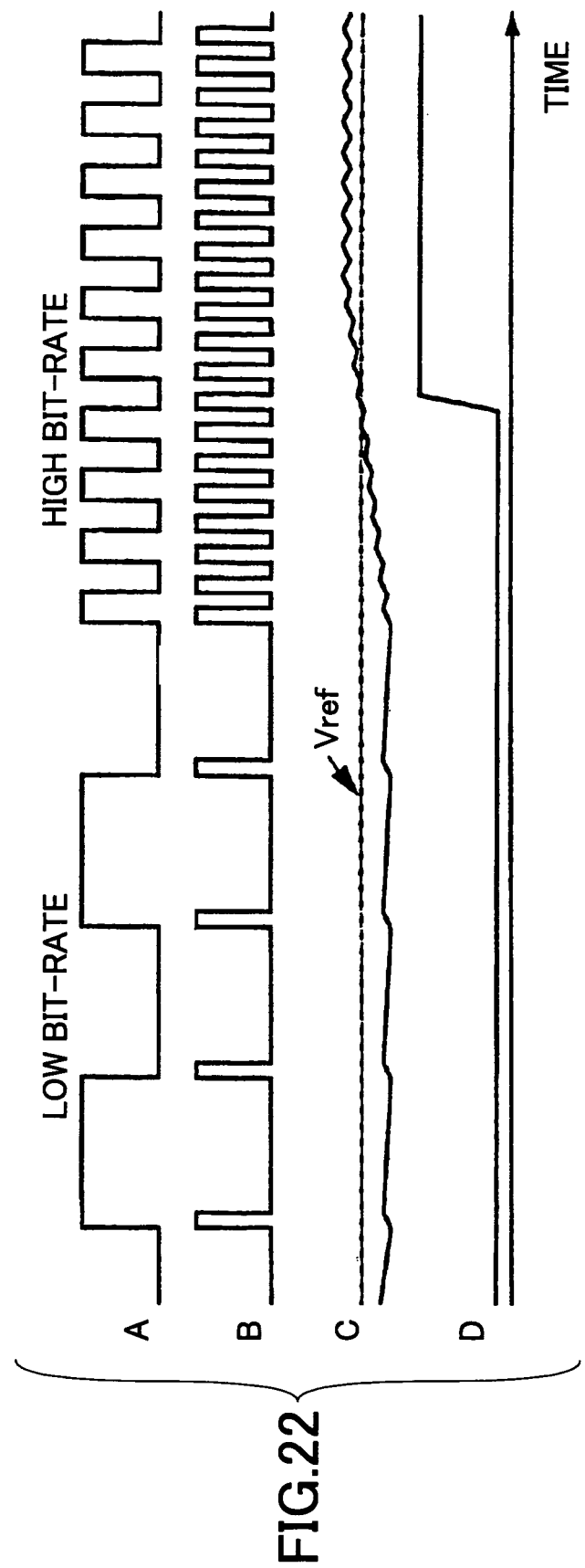
FIG. 22 is a waveform diagram for explaining the operation of the bit-rate discrimination circuit of FIG. 21.
Figure 23:
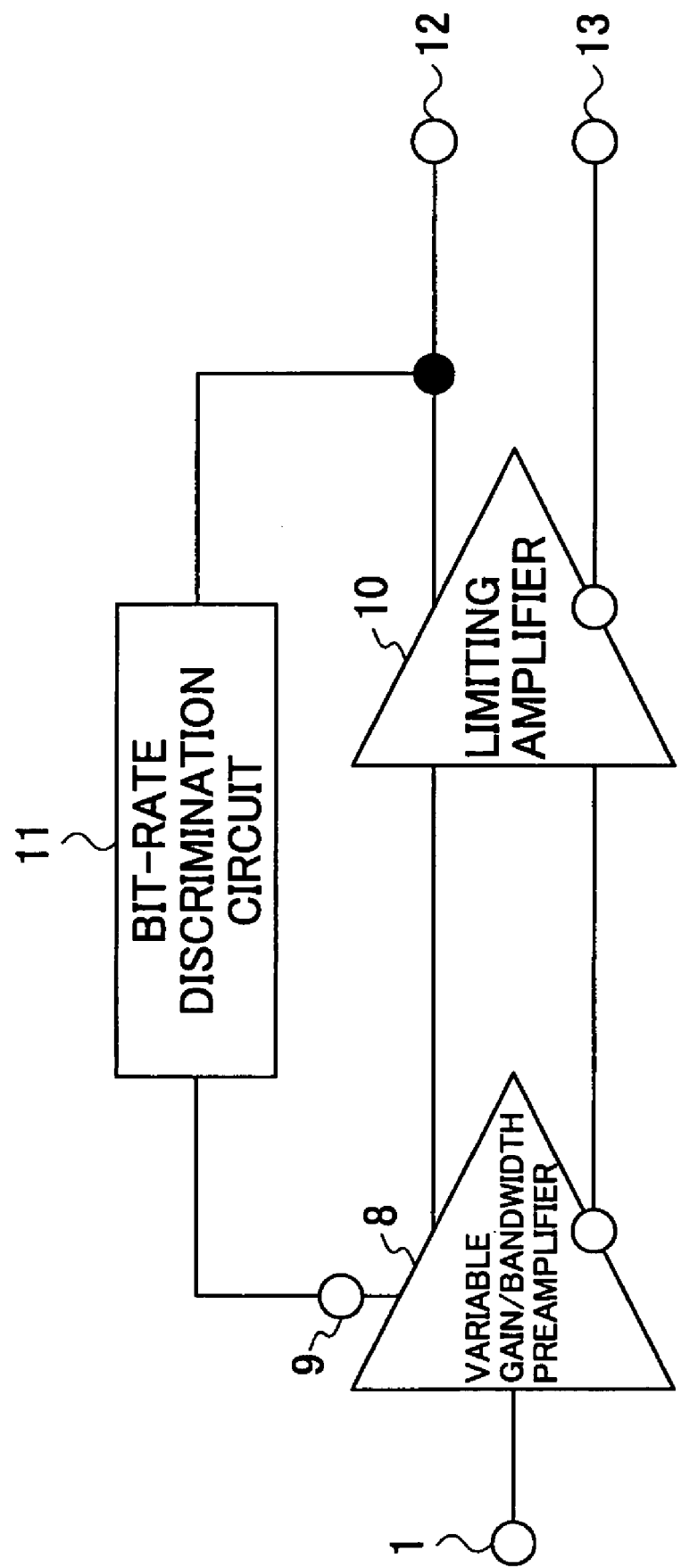
FIG. 23 is a block diagram showing a multi bit-rate reception circuit using the conventional bit-rate discrimination circuit.

A multi bit-rate reception circuit according to a seventh embodiment is described with reference to FIG. 20. FIG. 20 is a block diagram showing a multi bit-rate reception circuit capable of discriminating more than two bit-rates using the bit-rate discrimination circuits according to the present invention. The circuit uses the variable gain/bandwidth preamplifier of which gain and bandwidth can be adjusted by an analog signal. In FIG. 20, reference numerals 1-38 denotes the similar components to those shown in FIG. 19; and 39 denotes a N input D/A converter. The N bit-rate discrimination circuits 34 are provided in parallel, and each of them output either a high level or a low level. The number of the high level signals and the number of the low level signals output from the N bit-rate discrimination circuits 34 is determined by the bit-rate of the input signal. The N parallel signals are converted into a voltage signal in dependence on the number of the high level signals and the number of the low level signals. The converted voltage signal is input to the variable gain/bandwidth preamplifier 8 to adjust the feedback resistor such that the gain and bandwidth of the variable gain/bandwidth preamplifier 8 is optimized for the bit-rate of the input signal. The circuit designed as above can achieve the desired functionality. FIG. 20 shows the circuit in which the bit-rate discrimination circuits 34 according to the first embodiment of its variations are provided in parallel for convenience. However, the bit-rate discrimination circuit 35 according to the second embodiment or its variation may be used. In such a case, a differential type branch or distribution circuit is used as 38, and its differential input terminals are connected to the output terminals 12 and 13 of the limiting amplifier 10 as shown in FIG. 18.

The preferred embodiments of the present invention are described in detail above. The present invention is not limited to the above embodiments, and variations and modifications can be made without departing from the scope and teachings of the present invention.

The invention claimed is:

1. A bit-rate discrimination circuit for determining which bit-rate an input signal has from one of a first bit-rate and a second bit-rate higher than the first bit-rate, the circuit comprising:

an integration unit configured to distinguish a difference in a frequency component present in a signal having the first bit-rate and a frequency component present in a signal having the second bit-rate such that when the input signal is determined to have the second bit rate, the input signal is filtered out, and when the input signal is determined to have the first bit rate, at least a portion of a low frequency component of the input signal is allowed to pass through;

a determination unit configured to output a signal indicating whether the input signal which has passed through the integration unit has the first bit rate or the second bit rate, the determination unit being a hysteresis comparator, a threshold voltage of the hysteresis comparator being set such that the first bit-rate and the second bit-rate are discriminated;

a smoothing unit configured to output a signal corresponding to an average of the signal output from the determination unit; and a level conversion unit configured to convert the output of the smoothing unit to a logic level, wherein the logic level indicates presence or absence of the first bit rate for the input signal.

2. The bit-rate discrimination circuit as claimed in claim 1, wherein
said integration unit comprises two integrators;
said determination unit is a differential hysteresis comparator; and
the two integrators are connected to respective differential inputs of the differential hysteresis comparator.

3. The bit-rate discrimination circuit as claimed in claim 2, wherein
the level conversion unit has two differential input terminals; and
one of the differential input terminals of the level conversion unit is coupled with an output of the smoothing unit, and another of the differential input terminals is used as a reference voltage input terminal.

4. The bit-rate discrimination circuit as claimed in claim 1, wherein
the combination of said integration unit and said determination unit is a hysteresis comparator.

5. The bit-rate discrimination circuit as claimed in claim 1, wherein
the combination of said smoothing unit and said level conversion unit is a conversion unit having frequency characteristics such that the output signal from said determination unit is smoothed.

6. The bit-rate discrimination circuit as claimed in claim 1, wherein
said smoothing unit is an integrator, and
said level conversion unit is a comparator.

7. A bit-rate discrimination circuit for determining which one of N+1 bit-rates an input signal has, the circuit comprising N bit-rate discrimination circuits as claimed in claim 1, wherein the frequency characteristics of the frequency selection units of said N bit-rate discrimination circuits are determined such that N pairs of adjacent ones of the N+1 bit-rates are discriminated.

8. A multi bit-rate reception circuit capable of adjusting sensitivity thereof for each one of a plurality of bit-rates, comprising:

a preamplifier configured to amplify an input signal;

a main amplifier configured to amplify an output signal from said preamplifier to constant amplitude; and the bit-rate discrimination circuit as claimed in claim 1, configured to adjust the bandwidth and gain of said preamplifier based on a signal amplified by said preamplifier and said main amplifier.

9. The multi bit-rate reception circuit as claimed in claim 8, wherein the input signal has one of N+1 bit-rates (N is an integer greater than 1);

the multi bit-rate reception circuit comprises N bit-rate discrimination circuits, the bit-rate discrimination circuits configured to discriminate N pairs of adjacent ones of the N+1 bit-rates.

10. The bit-rate discrimination circuit as claimed in claim 1, wherein said integration unit and said determination unit together constitute a hysteresis comparator; and said smoothing unit and said level conversion unit together constitute a conversion unit having frequency characteristics such that the output signal from said determination unit is smoothed.

11. The bit-rate discrimination circuit as claimed in claim 1, wherein the input signal includes the first bit-rate or the second bit-rate, but does not have both the first bit-rate and the second bit-rate simultaneously.

12. The bit-rate discrimination circuit as claimed in claim 6, further comprising a D/A converter configured to convert a digital output from said comparator into an analog signal.

13. The bit-rate discrimination circuit as claimed in claim 1, wherein the threshold voltage of the hysteresis comparator is a first threshold voltage and a second threshold voltage is further set in the hysteresis comparator which is lower than the first threshold voltage, and the hysteresis comparator outputs a high voltage when the input signal received from the integration unit is higher than the first threshold voltage, the hysteresis comparator outputs a low voltage when the input signal received from the integration unit is lower than the second threshold voltage, and the hysteresis comparator does not change when the input signal is between the first threshold voltage and the second threshold voltage.

14. A method of determining which bit-rate an input signal has from one of a first bit-rate and a second bit-rate higher than the first bit-rate, for a bit-rate discrimination circuit, the method comprising the steps of:

receiving, at the bit-rate discrimination circuit, the input signal;

distinguishing, at an integration unit of the bit-rate discrimination circuit, a difference in a frequency component present in a signal having the first bit-rate and frequency component in a signal having the second bit-rate such that when the input signal is determined to have the second bit rate, the input signal is filtered out, and when the input signal is determined to have the first bit rate, at least a portion of a low frequency component of the input signal is allowed to pass through;

outputting, at a determination unit of the bit-rate discrimination circuit, a result signal indicating whether the input signal which has passed through the integration unit has the first bit rate or the second bit rate, the determination unit being a hysteresis comparator, a threshold voltage of the hysteresis comparator being set such that the first bit-rate and the second bit-rate are discriminated;

smoothing, at a smoothing unit of the bit-rate discrimination circuit, the result signal by outputting a signal corresponding to an average of the result signal;

converting, at a level conversion unit of the bit-rate discrimination circuit, the smoothed signal into a logic level, wherein the logic level indicates presence or absence of the first bit rate for the input signal; and outputting, at the bit-rate discrimination circuit, the logic level.

* * * * *